(12) United States Patent
Lichtenwalner et al.

(10) Patent No.: US 11,222,955 B2
(45) Date of Patent: Jan. 11, 2022

(54) SEMICONDUCTOR POWER DEVICES HAVING GATE DIELECTRIC LAYERS WITH IMPROVED BREAKDOWN CHARACTERISTICS AND METHODS OF FORMING SUCH DEVICES

(71) Applicant: Wolfspeed, Inc., Durham, NC (US)

(72) Inventors: Daniel Jenner Lichtenwalner, Raleigh, NC (US); Brett Hull, Raleigh, NC (US); Edward Robert Van Brunt, Raleigh, NC (US); Shadi Sabri, Cary, NC (US); Matt N. McCain, Raleigh, NC (US)

(73) Assignee: Wolfspeed, Inc., Durham, NC (US)

(*) Notice: Subject to any disclaimer, the term of this patent is extended or adjusted under 35 U.S.C. 154(b) by 0 days.

(21) Appl. No.: 16/854,959

(22) Filed: Apr. 22, 2020

(65) Prior Publication Data

US 2021/0336021 A1 Oct. 28, 2021

(51) Int. Cl.
*H01L 29/423* (2006.01)
*H01L 29/06* (2006.01)
*H01L 29/78* (2006.01)
*H01L 29/66* (2006.01)
(Continued)

(52) U.S. Cl.
CPC .... *H01L 29/42368* (2013.01); *H01L 29/0653* (2013.01); *H01L 29/401* (2013.01); *H01L 29/4236* (2013.01); *H01L 29/66068* (2013.01); *H01L 29/7397* (2013.01); *H01L 29/7813* (2013.01)

(58) Field of Classification Search
CPC .......... H01L 29/42368; H01L 29/0653; H01L 29/401; H01L 29/4236; H01L 29/66068; H01L 29/7397; H01L 29/7813
See application file for complete search history.

(56) References Cited

U.S. PATENT DOCUMENTS 5,907,188 A 5/1999 Nakajima et al.
2013/0134598 A1* 5/2013 Anderson ........... H01L 29/7824
257/773

(Continued)

FOREIGN PATENT DOCUMENTS

EP 2843707 A1 3/2015
JP 2011091125 A 5/2011
WO 2010073991 A1 7/2010

OTHER PUBLICATIONS

"Notification of Transmittal of the International Search Report and the Written Opinion of the International Searching Authority, or the Declaration for corresponding International Application No. PCT/US2021/027897, dated Jul. 28, 2021, (15 pages)".

*Primary Examiner* — Douglas W Owens
(74) *Attorney, Agent, or Firm* — Myers Bigel, P.A.

(57) ABSTRACT

A semiconductor device includes a semiconductor layer structure that includes silicon carbide, a gate dielectric layer on the semiconductor layer structure, and a gate electrode on the gate dielectric layer opposite the semiconductor layer structure. In some embodiments, a periphery of a portion of the gate dielectric layer that underlies the gate electrode is thicker than a central portion of the gate dielectric layer, and a lower surface of the gate electrode has recessed outer edges such as rounded and/or beveled outer edges.

20 Claims, 16 Drawing Sheets

(51) Int. Cl.
    *H01L 29/739*    (2006.01)
    *H01L 29/40*    (2006.01)

(56) References Cited

U.S. PATENT DOCUMENTS

| | | | |
|---|---|---|---|
| 2015/0179793 A1* | 6/2015 | Denison | H01L 29/404 |
| | | | 257/337 |
| 2015/0236151 A1* | 8/2015 | McMahon | H01L 29/7802 |
| | | | 257/77 |
| 2015/0287797 A1* | 10/2015 | Yu | H01L 29/6659 |
| | | | 257/336 |
| 2016/0181419 A1* | 6/2016 | Ryu | H01L 29/7835 |
| | | | 257/343 |
| 2018/0175192 A1* | 6/2018 | Fujii | H01L 29/42368 |
| 2019/0035929 A1* | 1/2019 | Syue | H01L 29/42368 |
| 2019/0172946 A1* | 6/2019 | Wu | H01L 29/1095 |
| 2020/0312666 A1* | 10/2020 | Kim | H01L 29/0653 |

* cited by examiner

US 11,222,955 B2

SEMICONDUCTOR POWER DEVICES HAVING GATE DIELECTRIC LAYERS WITH IMPROVED BREAKDOWN CHARACTERISTICS AND METHODS OF FORMING SUCH DEVICES

FIELD

The present invention relates to semiconductor devices and, more particularly, to power semiconductor switching devices.

BACKGROUND

The Metal Insulating Semiconductor Field Effect Transistor ("MISFET") is a well-known type of semiconductor transistor that may be used as a switching device. A MISFET is a three terminal device that has gate, drain and source terminals and a semiconductor body. A source region and a drain region are formed in the semiconductor body that are separated by a channel region, and a gate electrode (which may act as the gate terminal or be electrically connected to the gate terminal) is disposed adjacent the channel region. A MISFET may be turned on or off by applying a bias voltage to the gate electrode. When a MISFET is turned on (i.e., it is in its "on-state"), current is conducted through the channel region of the MISFET between the source region and drain regions. When the bias voltage is removed from the gate electrode (or reduced below a threshold level), the current ceases to conduct through the channel region. By way of example, an n-type MISFET has n-type source and drain regions and a p-type channel. An n-type MISFET thus has an "n-p-n" design. An n-type MISFET turns on when a gate bias voltage is applied to the gate electrode that is sufficient to create a conductive n-type inversion layer in the p-type channel region that electrically connects the n-type source and drain regions, thereby allowing for majority carrier conduction therebetween.

The gate electrode of a power MISFET is typically separated from the channel region by a thin gate dielectric layer. In most cases, the gate dielectric layer is an oxide layer (e.g., a silicon oxide layer). A MISFET that has an oxide gate dielectric layer is referred to as a Metal Oxide Semiconductor Field Effect Transistor ("MOSFET"). As oxide gate dielectric layers are almost always used due to their superior properties, the discussion herein will focus on MOSFETs as opposed to MISFETs, but it will be appreciated that the techniques according to embodiments of the present invention that are described herein are equally applicable to devices having gate dielectric layers formed with materials other than oxides.

Because the gate electrode of the MOSFET is insulated from the channel region by the gate dielectric layer, minimal gate current is required to maintain the MOSFET in its on-state or to switch a MOSFET between its on-state and its off-state. The gate current is kept small during switching because the gate forms a capacitor with the channel region. Thus, only minimal charging and discharging current is required during switching, allowing for less complex gate drive circuitry and faster switching speeds. MOSFETs may be stand-alone devices or may be combined with other circuit devices. For example, an Insulated Gate Bipolar Transistor ("IGBT") is a semiconductor device that includes both a MOSFET and a Bipolar Junction Transistor ("BJT") that combines the high impedance gate electrode of the MOSFET with small on-state conduction losses that may be provided by a BJT. An IGBT may be implemented, for example, as a Darlington pair that includes a high voltage n-channel MOSFET at the input and a BJT at the output. The base current of the BJT is supplied through the channel of the MOSFET, thereby allowing a simplified external drive circuit (since the drive circuit only charges and discharges the gate electrode of the MOSFET).

There is an increasing demand for high power semiconductor switching devices that can pass large currents in their "on" state and block large voltages (e.g., thousands of volts) in their reverse blocking state. In order to support high current densities and block such high voltages, power MOSFETs and IGBTs typically have a vertical structure with the source and drain on opposite sides of a thick semiconductor layer structure in order to block higher voltage levels. In very high power applications, the semiconductor switching devices are typically formed in wide band-gap semiconductor material systems (herein, the term "wide band-gap semiconductor" encompasses any semiconductor having a band-gap of at least 1.4 eV) such as, for example, silicon carbide ("SiC"), which has a number of advantageous characteristics including, for example, a high electric field breakdown strength, high thermal conductivity, high electron mobility, high melting point and high-saturated electron drift velocity. Relative to devices formed using other semiconductor materials such as, for example, silicon, electronic devices formed using silicon carbide may have the capability of operating at higher temperatures, at high power densities, at higher speeds, at higher power levels and/or under high radiation densities.

One failure mechanism for a power MOSFET is so-called "breakdown" of the gate oxide layer. When power MOSFETs are in their conducting or "on" state, the gate oxide layer is subjected to high electric fields. The stress on the gate oxide layer caused by these electric fields generates defects in the oxide material that build up over time. When the concentration of defects reaches a critical value, a so-called "percolation path" may be created through the gate oxide layer that electrically connects the gate electrode to the source region underlying semiconductor layer structure, thereby short-circuiting the gate electrode and the source region, which can destroy the device. The "lifetime" of a gate oxide layer (i.e., how long the device can be operated before breakdown occurs) is a function of, among other things, the magnitude of the electric field that the gate oxide layer is subjected to and the length of time for which the electric field is applied. FIG. 1 is a schematic graph illustrating the relationship between the operating time until breakdown occurs (the "gate oxide lifetime") and the level of the electric field applied to the gate oxide layer. This graph assumes that the same electric field is always applied (which is not necessarily the case), and assumes a gate oxide layer having a certain thickness. As shown in FIG. 1, the relationship may, in some cases, be generally linear when the gate oxide lifetime is plotted on a logarithmic scale. The important point to take from FIG. 1 is that as the electric field level is increased, the lifetime of the gate oxide layer decreases exponentially. The lifetime of the gate oxide layer may be increased by increasing the thickness of the gate oxide layer, but the performance of the MOSFET also is a function of the thickness of the gate oxide layer and thus increasing the thickness of the gate oxide layer is typically not an acceptable way of increasing the lifetime of the gate oxide layer.

FIG. 2A is a schematic cross-sectional view of a conventional silicon power MOSFET 100. As shown in FIG. 2A, the MOSFET 100 includes an n-type silicon substrate 110. A lightly-doped n-type (n−) silicon drift layer 120 is provided on the silicon substrate 110. Regions referred to as "wells" or "p-wells" 130 that have p-type conductivity are formed in upper portions of the n-type silicon drift layer 120. The p-wells 130 may be formed, for example, by counter-doping portions of the n-type silicon drift layer 120 with p-type dopants. Heavily-doped (n+) n-type silicon source regions 140 are provided in upper portions of the p-wells 130. The n-type source regions 140 may be formed by counter-doping portions of the p-wells 130 with n-type dopants. The drift layer 120 and the substrate 110 together act as a common drain region for the device 100. The substrate 110, drift layer 120, p-wells 130, and source regions 140 together comprise a semiconductor layer structure 150 of the MOSFET 100. A silicon dioxide ($SiO_2$) gate oxide layer 160 is provided on the upper surface of the semiconductor layer structure 150. A gate electrode 170 is provided on the gate oxide layer 160 opposite the semiconductor layer structure 150. A dielectric isolation pattern 180 is formed on the gate electrode 170, and source metallization 190 is formed on the dielectric isolation pattern 180 and on the exposed source regions 140. A drain contact (not shown) is typically provided on the lower surface of the substrate 110, opposite the drift layer 120.

FIG. 2B is a schematic cross-sectional view of another conventional silicon MOSFET 100' in which an oxidation anneal is performed after a gate electrode layer is patterned to form the gate electrode (the gate dielectric layer 160 may or may not also be patterned). Prior to the oxidation anneal, MOSFET 100' has source regions 140, a gate oxide layer 160 and a gate electrode 170 that are identical to the source regions 140, gate oxide layer 160 and gate electrode 170 of MOSFET 100. The gate oxidation anneal converts the source regions 140, gate oxide layer 160 and gate electrode 170 into source regions 140', a gate oxide layer 160' and a gate electrode 170', as explained below.

The oxidation anneal is performed after the gate oxide layer 160 and the gate electrode 170 (see FIG. 2A) are formed but prior to formation of the dielectric isolation pattern 180. The oxidation anneal oxidizes exposed silicon surfaces, and hence converts exposed regions of the silicon gate electrode 170 to silicon oxide, converting the gate electrode 170 into a gate electrode 170'. The gate electrode 170' is smaller in size than gate electrode 170 (since a portion of gate electrode 170 is converted to silicon oxide) and the conversion forms a silicon oxide pattern 172 on the top surface and sidewalls of gate electrode 170'. Note that the heaviest oxidation occurs at the top corner regions since at the corners two sides are exposed allowing for increased oxidation. As can also be seen in FIG. 2B, the interface between the gate oxide layer 160 and the gate electrode 170 also provides a favorable oxidation path, so that the lower surface of the gate electrode 170' is also oxidized around its periphery, with the amount of the lower surface that is oxidized decreasing with increasing distance from the lower corners of the gate electrode 170'. The portion of the lower surface of gate electrode 170 that is converted to silicon oxide effectively becomes part of the gate oxide layer 160 to provide the gate oxide layer 160'. Thus, the oxidation acts to reduce the size of the gate electrode 170 (thereby forming gate electrode 170') and increases the thickness of the outer portion of the gate oxide layer 160 (thereby forming gate oxide layer 160').

A similar phenomenon occurs at the interface between the lower surface of the gate oxide layer 160 and the source regions 140, where the silicon source regions 140 are oxidized so that the gate oxide layer 160 effectively "grows" into the semiconductor layer structure 150 to form source regions 140'). Once again, the amount that the source regions 140 oxidize decreases with increasing distance from the outer edges of gate oxide layer 160. The result is that the outer portions of gate oxide layer 160' are thicker than a central portion of gate oxide layer 160', with the thickness tapering from each end toward the central portion. The central portion has a constant thickness. The thickened outer regions of the gate oxide layer 160' may improve the breakdown performance of MOSFET 100'.

SUMMARY

Pursuant to embodiments of the present invention, semiconductor devices are provided that include a semiconductor layer structure that comprises silicon carbide; a gate dielectric layer on the semiconductor layer structure; and a gate electrode on the gate dielectric layer opposite the semiconductor layer structure. A periphery of a portion of the gate dielectric layer that underlies the gate electrode is thicker than a central portion of the gate dielectric layer, and a lower surface of the gate electrode has recessed outer edges.

In some embodiments, the gate dielectric layer may include a silicon oxide layer and a silicon nitride layer.

In some embodiments, the silicon nitride layer may be located between the gate electrode and the silicon oxide layer.

In some embodiments, the silicon nitride layer may include an uppermost region of the periphery of the portion of the gate dielectric layer that underlies the gate electrode.

In some embodiments, the recessed outer edges of the gate electrode may comprise rounded outer edges and/or beveled outer edges.

In some embodiments, the semiconductor layer structure may include a drift layer having a first conductivity type, a well having a second conductivity type in an upper portion of the drift layer and a source region having the first conductivity type in an upper portion of the well, and a channel region may be provided in the well between the source region and a portion of the drift layer that contacts the gate dielectric layer. In some embodiments, a portion of the gate dielectric layer beneath the gate electrode that overlies the source region may be thicker than a portion of the gate dielectric layer that overlies the channel region. In some embodiments, a portion of the gate dielectric layer that overlies the channel region may have a constant thickness. In some embodiments, the semiconductor device may be configured so that during on-state operation a peak electric field value in the gate dielectric layer will be located substantially above a sidewall of the channel region that contacts the source region.

In some embodiments, a lower surface of the central portion of the gate dielectric layer may define a first plane that is parallel to a bottom surface of the semiconductor layer structure and an upper surface of the central portion of the gate dielectric layer may define a second plane that is parallel to the bottom surface of the semiconductor layer structure, and a first distance between the first plane and a lower surface of the periphery of the portion of the gate dielectric layer that underlies the gate electrode may be less than half a second distance between the second plane and an upper surface of the periphery of the portion of the gate dielectric layer that underlies the gate electrode.

In some embodiments, each recessed outer edge of the gate electrode may include multiple beveled or rounded regions.

In some embodiments, the semiconductor device may be configured so that during on-state operation a peak electric field value in the gate dielectric layer will be within 10% of a value of an electric field at an upper surface of the gate dielectric layer directly under the center of the gate electrode.

In some embodiments, a lower surface of the gate dielectric layer may be substantially flat.

In some embodiments, the semiconductor device is a MISFET or IGBT.

In some embodiments, the gate electrode may comprise silicon.

In some embodiments, the periphery of the portion of the gate dielectric layer that underlies the gate electrode that may be thicker than the central portion of the gate dielectric layer acts to increase the lifetime of the gate dielectric layer.

In some embodiments, a central portion of the gate electrode may extend further above the semiconductor layer structure than does a periphery of the upper surface of the gate electrode.

In some embodiments, a periphery of an upper surface of the gate electrode may be recessed.

In some embodiments, the semiconductor device may be a MOSFET, and the recessed outer edges of the lower surface of the gate electrode may be configured to reduce a peak value of the electric field in the gate dielectric layer when the MOSFET is in its on state.

In some embodiments, the recessed outer edges of the lower surface of the gate electrode comprise oxidized or nitridated material of the gate electrode.

Pursuant to further embodiments of the present invention, semiconductor devices are provided that include a semiconductor layer structure that includes silicon carbide, the semiconductor layer structure including a drift layer having a first conductivity type, a well having a second conductivity type that is opposite the first conductivity type in an upper portion of the drift layer, and a source region having the first conductivity type in the well; a gate dielectric layer on the semiconductor layer structure; and a gate electrode on the gate dielectric layer opposite the semiconductor layer structure. These semiconductor device are configured so that during on-state operation a location where a peak electric field value occurs is underneath the gate electrode and spaced inwardly from a sidewall of the gate electrode In some embodiments, the location in the gate dielectric layer where the peak electric field value occurs may be spaced inwardly from the sidewall of the electrode by at least 0.05 microns.

In some embodiments, the gate dielectric layer may include a silicon oxide layer and a silicon nitride layer.

In some embodiments, the silicon nitride layer may be located between the gate electrode and the silicon oxide layer.

In some embodiments, a lower surface of the gate electrode may have recessed outer edges.

In some embodiments, a channel region may be provided in the well between the source region and a portion of the drift layer that contacts the gate dielectric layer, and a portion of the gate dielectric layer beneath the gate electrode that overlies the source region may be thicker than a portion of the gate dielectric layer that overlies the channel region.

In some embodiments, a channel region may be provided in the well between the source region and a portion of the drift layer that contacts the gate dielectric layer, and the semiconductor device may be configured so that during on-state operation the peak electric field value in the gate dielectric layer will be located substantially above a sidewall of the channel region that contacts the source region.

In some embodiments, a lower surface of a central portion of the gate dielectric layer may define a first plane that is parallel to a bottom surface of the semiconductor layer structure and an upper surface of the central portion of the gate dielectric layer may define a second plane that is parallel to the bottom surface of the semiconductor layer structure, and a first distance between the first plane and a lower surface of a periphery of a portion of the gate dielectric layer that underlies the gate electrode may be less than half a second distance between the second plane and an upper surface of the periphery of the portion of the gate dielectric layer that underlies the gate electrode.

In some embodiments, the semiconductor device is configured so that during on-state operation the peak electric field value in the gate dielectric layer may be within 10% of a value of an electric field at an upper surface of the gate dielectric layer directly under the center of the gate electrode.

Pursuant to still further embodiments of the present invention, semiconductor devices are provided that include a semiconductor layer structure that includes silicon carbide, the semiconductor layer structure including a drift layer having a first conductivity type, a well having a second conductivity type that is opposite the first conductivity type in an upper portion of the drift layer, the well having a channel region therein, and a source region having the first conductivity type in the well; a gate dielectric layer on the semiconductor layer structure; and a gate electrode on the gate dielectric layer opposite the semiconductor layer structure. These semiconductor devices are configured so that during on-state operation a peak electric field value in the gate dielectric layer will be within 10% of a value of an electric field at an upper surface of the gate dielectric layer under a center portion of the gate electrode.

In some embodiments, the gate dielectric layer underneath the center portion of the gate electrode may have a substantially constant electric field value during on-state operation.

In some embodiments, the gate dielectric layer may includes a silicon oxide layer and a silicon nitride layer. The silicon nitride layer may include an uppermost region of a periphery of a portion of the gate dielectric layer that underlies the gate electrode.

In some embodiments, a lower surface of the gate electrode may have rounded or beveled outer edges.

In some embodiments, a portion of the gate dielectric layer beneath the gate electrode that overlies the source region may be thicker than a portion of the gate dielectric layer that overlies the channel region. In some embodiments, a portion of the gate dielectric layer that overlies the channel region may have a constant thickness.

In some embodiments, the semiconductor device may be configured so that during on-state operation the peak electric field value in the gate dielectric layer will be located substantially above a sidewall of the channel region that contacts the source region.

Pursuant to still further embodiments of the present invention, methods of forming semiconductor devices are provided in which a semiconductor layer structure is formed that includes silicon carbide, the semiconductor layer structure including a drift layer having a first conductivity type, a well having a second conductivity type that is opposite the first conductivity type in an upper portion of the drift layer, the well having a channel region therein, and a source region having the first conductivity type in the well. A gate dielectric layer is formed on the semiconductor layer structure. A gate electrode comprising silicon is formed on the gate dielectric layer opposite the semiconductor layer structure. The semiconductor layer structure, the gate dielectric layer and the gate electrode are then annealed in at least one of oxygen and nitrogen to convert an outer periphery of a lower surface of the gate electrode to silicon nitride while not converting a central portion of the lower surface of the gate electrode to silicon nitride.

In some embodiments, annealing the semiconductor layer structure, the gate dielectric layer and the gate electrode in at least one of oxygen and nitrogen may comprise annealing the semiconductor layer structure, the gate dielectric layer and the gate electrode in an atmosphere that includes nitrogen.

In some embodiments, the method may further comprise forming a dielectric isolation pattern on the gate electrode after annealing the semiconductor layer structure, the gate dielectric layer and the gate electrode in a nitrogen atmosphere.

In some embodiments, the method may further comprise forming a dielectric isolation pattern on the gate electrode prior to annealing the semiconductor layer structure, the gate dielectric layer and the gate electrode in a nitrogen atmosphere.

In some embodiments, the method may further comprise forming a metal pattern that is electrically isolated from the gate electrode and electrically connected to the source region after annealing the semiconductor layer structure, the gate dielectric layer and the gate electrode in a nitrogen atmosphere.

In some embodiments, the lower surface of the gate electrode may have recessed outer edges.

In some embodiments, the recessed outer edges may comprise beveled and/or rounded outer edges.

In some embodiments, a portion of the gate dielectric layer beneath the gate electrode that overlies the source region may be thicker than a portion of the gate dielectric layer that overlies the channel region.

In some embodiments, the semiconductor device may be configured so that during on-state operation a peak electric field value in the gate dielectric layer will be located substantially above a sidewall of the channel region that contacts the source region.

In some embodiments, the semiconductor device may be configured so that during on-state operation a peak electric field value in the gate dielectric layer will be within 10% of a value of an electric field at an upper surface of the gate dielectric layer directly under the center of the gate electrode.

Pursuant to additional embodiments of the present invention, methods of forming semiconductor devices are provided in which a semiconductor layer structure that includes silicon carbide is formed. A gate dielectric layer is formed on the semiconductor layer structure and a gate electrode is formed on the gate dielectric layer so that the gate dielectric layer electrically isolates the gate electrode from the semiconductor layer structure. The gate electrode comprises silicon. The semiconductor layer structure, gate dielectric layer and gate electrode are annealed in at least one of oxygen and nitrogen to convert at least bottom edges of the gate electrode into a dielectric material that becomes part of the gate dielectric layer so that upper edges of a periphery of a portion of the gate dielectric layer that underlies the gate electrode are thicker than a central portion of the gate dielectric layer.

In some embodiments, the method further comprises forming a dielectric isolation pattern on the gate electrode after annealing the semiconductor layer structure, the gate dielectric layer and the gate electrode in at least one of oxygen and nitrogen.

In some embodiments, the method further comprises forming a dielectric isolation pattern on the gate electrode prior to annealing the semiconductor layer structure, the gate dielectric layer and the gate electrode in at least one of oxygen and nitrogen.

In some embodiments, a lower surface of the gate electrode has recessed outer edges.

In some embodiments, the recessed outer edges comprise beveled and/or rounded outer edges.

In some embodiments, the semiconductor device is configured so that during on-state operation a peak electric field value in the gate dielectric layer will be located substantially above an outer sidewall of a channel region of the semiconductor device.

In some embodiments, the semiconductor device is configured so that during on-state operation a peak electric field value in the gate dielectric layer will be within 10% of a value of an electric field at an upper surface of the gate dielectric layer directly under the center of the gate electrode.

In some embodiments, an upper surface of the well extends farther above the drift layer than does an upper surface of the source region.

In some embodiments, the source region is in a central portion of the well, and an upper surface of the portion of the well on a first side of the source region extends farther above the drift layer than does an upper surface of the source region, and an upper surface of the portion of the well on a second side of the source region that is opposite the first side also extends farther above the drift layer than does the upper surface of the source region.

DETAILED DESCRIPTION

Figure 1:
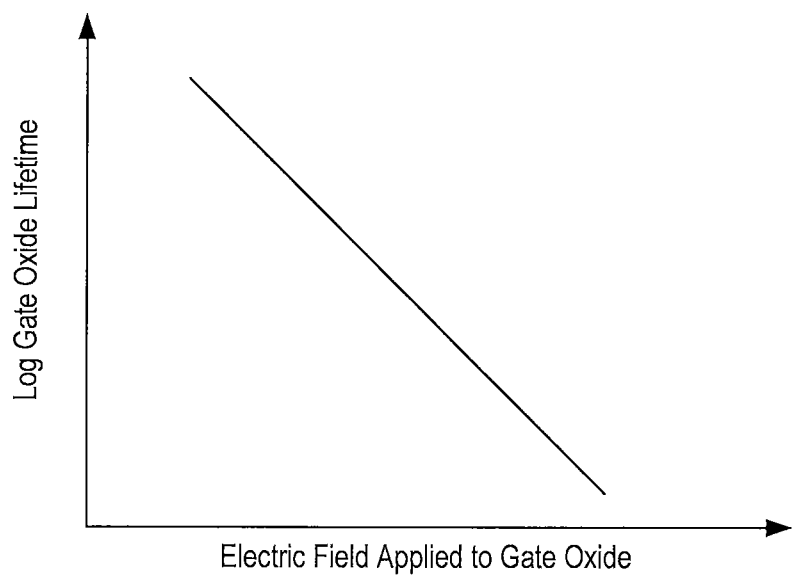
FIG. 1 is a graph illustrating the relationship between the lifetime of the gate dielectric layer as a function of applied electric field strength.
Figure 2A:
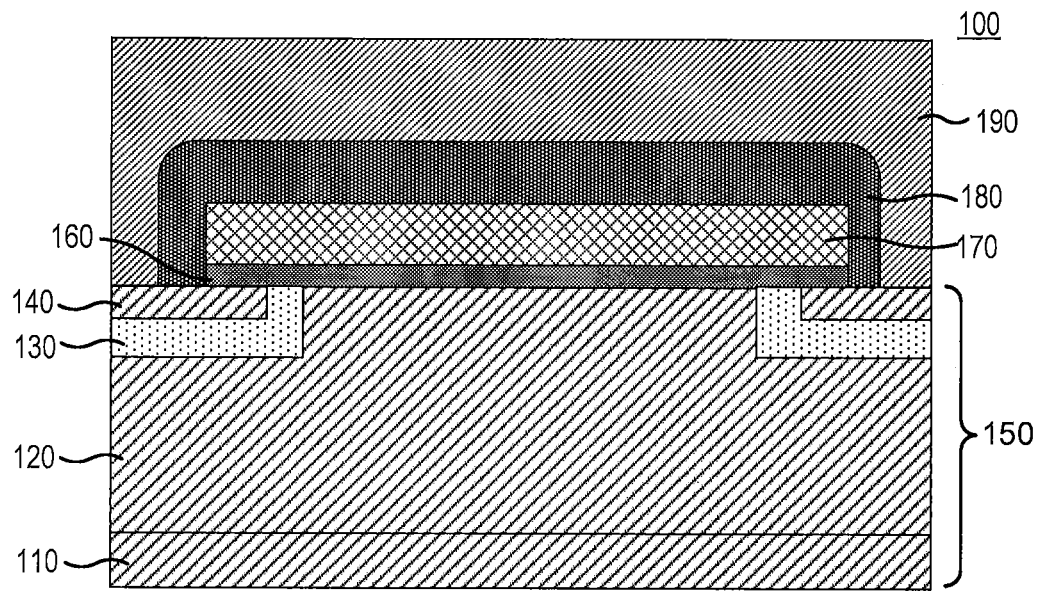
FIG. 2A is a schematic cross-sectional view of a conventional silicon MOSFET.
Figure 2B:
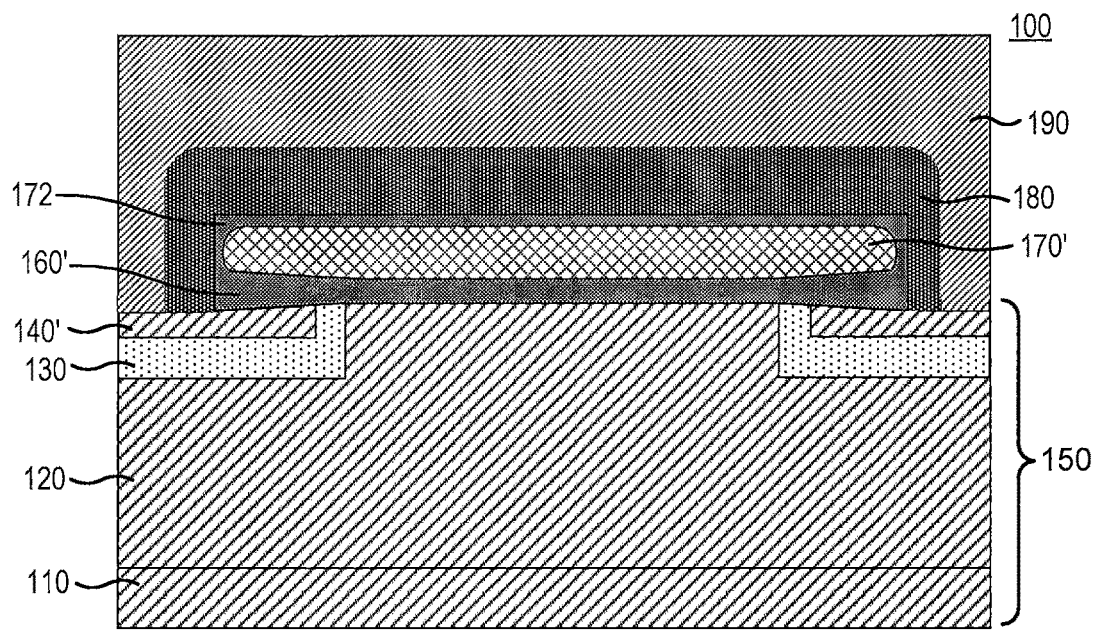
FIG. 2B is a schematic cross-sectional view of another conventional silicon MOSFET.

Power silicon carbide based MOSFETs are in use today for applications requiring high voltage blocking. By way of example, silicon carbide MOSFETs are commercially available that are rated for current densities of 10 A/cm$^2$ or more that will block voltages of at least 10 kV. To form such devices, a plurality of "unit cells" are typically formed, where each unit cell includes a MOSFET transistor. In high power applications, a large number of these unit cells (e.g., hundreds or thousands) are typically provided on a semiconductor substrate, and a gate electrode pattern is formed on a top side of the semiconductor substrate that acts as the gate electrode for all of the unit cells. The opposite (bottom) side of the semiconductor substrate acts as a common drain for all of the unit cells of the device. A plurality of source contacts are formed on source regions in the semiconductor layer structure that are exposed within openings in the gate electrode pattern. These source contacts are also electrically connected to each other to serve as a common source. The resulting device has three terminals, namely a common source terminal, a common drain terminal and a common gate electrode that act as the terminals for the hundreds or thousands of individual unit cell transistors. It will be appreciated that the above description is of an n-type MOSFET; the locations of the drain and source would be reversed for a p-type MOSFET, and the conductivity types of the n-type and p-type regions would be reversed.

Pursuant to embodiments of the present invention, semiconductor devices are provided that have improved gate dielectric layers that will exhibit increased lifetimes. When a MOSFET is in its "on" or conducting state, an electric field is generated within the gate dielectric layer of the device. Generally speaking, the strength of this electric field is particularly high in the portions of the gate dielectric layer that are directly underneath the sidewalls of the gate electrode. As discussed above, the lifetime of the gate dielectric layer is a function of the intensity of the electric field in the gate dielectric layer. Thus, since the portions of the gate dielectric layer that are underneath the sidewalls of the gate electrode are subjected to the highest electric fields, these are the regions that will typically first experience breakdown. It will be appreciated that herein references to a "gate dielectric layer" encompass both a continuous gate dielectric layer as well as a patterned gate dielectric layer.

Unfortunately, the portion of the gate dielectric layer that experiences the highest electric field values during on-state operation is also the portion that is susceptible to damage as a result of over-etching during the etch process that is used to form the gate electrode and the gate dielectric layer. As such, in some percentage of devices, the outer edges of the gate dielectric layer may already be thinned due to overetching, and therefore more susceptible to breakdown. Moreover, the dielectric isolation pattern that is formed over the gate electrode and sidewalls of the gate dielectric layer may not always be sufficiently densified. Since the peak electric field value typically occurs directly adjacent this dielectric isolation pattern, the electric field that extends into the dielectric isolation pattern may still be relatively high, and hence breakdown of the dielectric isolation pattern is another potential failure mechanism. Additionally, the region where the highest electric fields are experienced is in an outer portion of the gate dielectric layer that overlies the source region. Since the failure mechanism for a MOSFET experiencing breakdown is the development of a short circuit between the gate electrode and the source region, the fact that the portion of the gate dielectric layer that directly overlies the source region is the portion that is most susceptible to breakdown tends to shorten the time to device failure due to breakdown.

The power semiconductor devices according to embodiments of the present invention are subjected to an oxidation and/or nitridation anneal in order to oxidize the lower surface of the gate electrode, which typically (but not always) is a silicon (e.g., polysilicon) gate electrode. The anneal may be performed so that the periphery of the lower surface of the gate electrode is converted into dielectric material effectively forming a recess around the periphery of the lower surface of the gate electrode. In some embodiments, the recesses may take the form of a rounding of the intersection of the lower surface and sidewalls of the gate electrode. In other embodiments, the intersections between the lower surface and the sidewalls of the gate electrode may be beveled. Other recesses (e.g., curved, scalloped, etc.) or combinations of different types of recesses (e.g., two bevels, a bevel and rounding, etc.) may be provided in some embodiments. Since the oxidation and/or nitridation anneal converts a portion of the gate electrode into a dielectric material (e.g., silicon nitride and/or silicon oxide), the anneal increases the thickness of the gate dielectric layer underneath the periphery of the gate electrode, which can increase the lifetime of the gate dielectric layer. Additionally, the rounding or beveling of the lower edges of the gate electrode also reduces the peak value of the electric field associated with a given voltage that is applied to the gate electrode. As discussed above with reference to FIG. 1, the expected lifetime of a gate oxide layer is an exponential function of the applied electric field. Thus, by reducing the applied electric field for a given gate voltage level, the lifetime of the device may be extended. Finally, in addition to reducing the peak electric field value in the gate dielectric layer, the rounding and/or beveling of the lower edges of the gate electrode acts to move inwardly the location where the peak electric field value occurs within the gate dielectric layer. This phenomena advantageously moves the location away from the source region so that any damage to the gate dielectric layer due to dielectric breakdown is less likely to result in a short circuit between the gate electrode and the source region. Thus, for all of these reasons, the semiconductor devices according to embodiments of the present invention are expected to exhibit longer lifetimes than comparable conventional devices operated under the same operating conditions.

The thickness of the portion of a gate dielectric layer of a MOSFET (or MISFET) that overlies the channel region of the device should be constant (i.e., variation of less than 5%) in order to ensure optimum device operation. Thus, while it is desirable to increase the thickness of the gate dielectric layer that overlies the source regions, it may also be important that the portion of the gate electrode that is above the channel region not be converted to dielectric material. Fortunately, the outer periphery of the lower surface of the gate electrode may oxidize (and/or nitridate) quickly, but this process slows considerably with increasing distance from the sidewalls of the gate dielectric layer. Consequently, it is possible to convert a portion of the outer periphery of the lower surface of the gate electrode that is above the source region to dielectric material while not converting the portion of the outer periphery of the lower surface of the gate electrode that is above the channel region into dielectric material.

In some embodiments, a nitridation anneal may be used that not only acts to increase the thickness of upper periphery of the gate dielectric layer, but which also may form a nitride interface layer between the semiconductor layer structure and the gate dielectric layer. This interface layer may reduce an on-state resistance of the MOSFET when the device is conducting.

Pursuant to some embodiments of the present invention, semiconductor devices are provided that include a semiconductor layer structure that includes silicon carbide, a gate dielectric layer on the semiconductor layer structure, and a gate electrode on the gate dielectric layer opposite the semiconductor layer structure. In some embodiments, a periphery of a portion of the gate dielectric layer that underlies the gate electrode is thicker than a central portion of the gate dielectric layer, and a lower surface of the gate electrode has recessed outer edges such as rounded and/or beveled outer edges. In other embodiments, the device may be configured so that during on-state operation a location of the peak electric field in the gate dielectric layer is underneath the gate electrode and spaced inwardly from a sidewall of the gate electrode. In still other embodiments, the device may be configured so that during on-state operation a peak electric field value in the gate dielectric layer will be within 5%, 8%, 10%, 12% or 15% of a value of the electric field at the upper surface of the gate dielectric layer directly under the center of the gate electrode.

Pursuant to further embodiments of the present invention, methods of forming semiconductor devices are provided in which a semiconductor layer structure is formed that includes silicon carbide, the semiconductor layer structure including a drift layer having a first conductivity type, a well having a second conductivity type that is opposite the first conductivity type in an upper portion of the drift layer, the well having a channel region therein, and a source region having the first conductivity type in the well. A gate dielectric layer is formed on the semiconductor layer structure. A silicon gate electrode is formed on the gate dielectric layer opposite the semiconductor layer structure. The semiconductor layer structure, gate dielectric layer and gate electrode are then annealed in a nitrogen atmosphere to convert an outer periphery of a lower surface of the gate electrode to silicon nitride while not converting a central portion of the lower surface of the gate electrode to silicon nitride. The annealing step may additionally or alternatively convert at least bottom edges of the gate electrode into a dielectric material that becomes part of the gate dielectric layer so that upper edges of a periphery of a portion of the gate dielectric layer that underlies the gate electrode are thicker than a central portion of the gate dielectric layer while a bottom surface of the gate dielectric layer remains substantially flat.

The above-described process includes a number of important differences as compared to the oxidation anneal that has been performed in some conventional silicon devices. In particular, in silicon devices, the silicon semiconductor layer structure oxidizes very easily to form silicon oxide, and hence during the anneal the gate oxide layer grows not only upwardly, but also downwardly, as it grows into the source regions. This may limit the process conditions that can be used in the annealing step, and results in a gate dielectric layer that has a fundamentally different shape. Additionally, dopants diffuse readily in silicon, such as the dopants used to form the wells and the source regions, and hence lower annealing temperatures must be used to prevent undesired diffusion of dopants in the semiconductor layer structure. In contrast, dopants do not move readily in silicon carbide so that more aggressive annealing conditions may be used. Additionally, in silicon devices, an oxidation anneal must be used because silicon nitride dielectric layers have poor channel properties, which is why modern silicon MISFET devices use silicon oxide gate dielectric layers. In the techniques according to embodiments of the present invention, nitridation anneals may be used, if desired.

Semiconductor devices according to embodiments of the present invention will now be described in greater detail with reference to FIGS. 3-12C.

Figure 3:
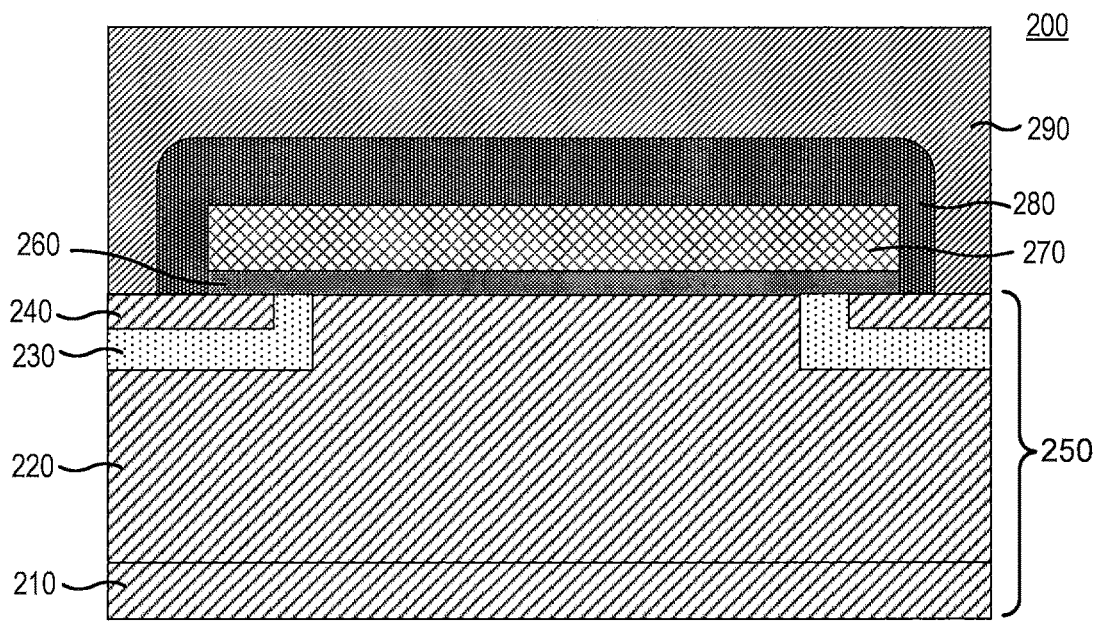
FIG. 3 is a schematic cross-sectional view of a conventional silicon carbide MOSFET.

FIG. 3 is a schematic cross-sectional view of a unit cell of a conventional silicon carbide vertical power MOSFET 200. As shown in FIG. 3, the conventional MOSFET 200 is formed using a heavily-doped (n+) n-type silicon carbide semiconductor substrate 210. A lightly-doped (n−) n-type silicon carbide drift layer 220 is provided on the substrate 210. Upper portions of the n-type silicon carbide drift layer 220 may be doped p-type to form p-wells 230. Heavily-doped (n+) n-type silicon carbide source regions 240 are formed in upper portions of the p-wells 230. The drift layer 220 and the substrate 210 together act as a common drain region for the device 200. The n-type silicon carbide substrate 210, the n-type silicon carbide drift layer 220, the p-wells 230, and the n-type source regions 240 formed therein together comprise a semiconductor layer structure 250 of the device 200.

A gate dielectric layer 260 is formed on the upper surface of the semiconductor layer structure 250. The gate dielectric layer 260 typically comprises a silicon oxide ($SiO_2$) layer. A gate electrode 270 is formed on the gate dielectric layer 260 opposite the semiconductor layer structure 250. A dielectric isolation pattern 280 is formed on the gate electrode 270, and source metallization 290 is formed on the dielectric isolation pattern 280 and on the exposed source regions 240. A drain contact (not shown) is provided on the lower surface of the substrate 210.

Figure 4:
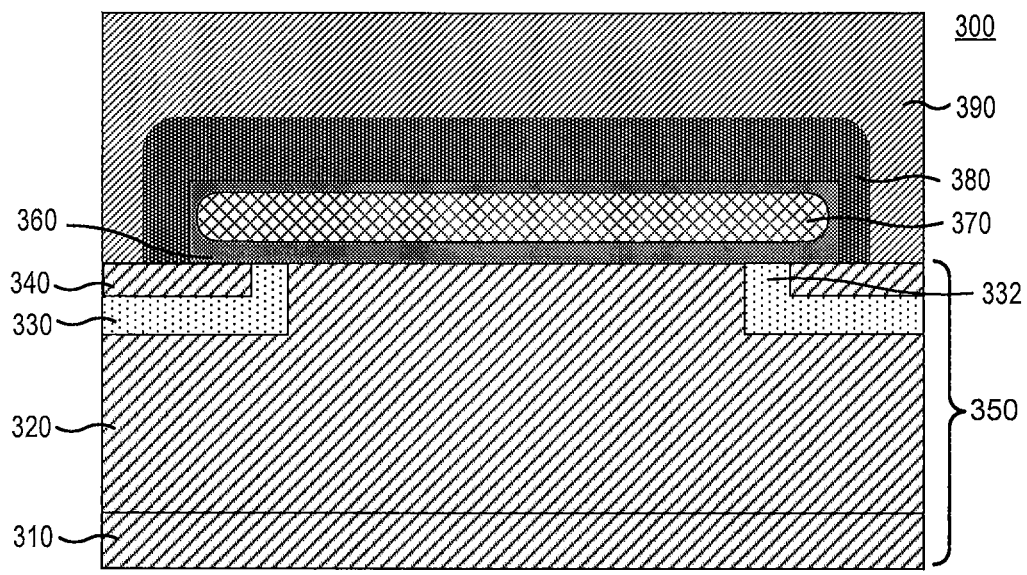
FIG. 4 is a schematic cross-sectional view of a MOSFET according to embodiments of the present invention.

FIG. 4 is a schematic cross-sectional view of a unit cell of a MOSFET 300 according to embodiments of the present invention.

As shown in FIG. 4, the MOSFET 300 includes an n-type silicon carbide semiconductor substrate 310. The substrate 310 may comprise, for example, a single crystal 4H silicon carbide semiconductor substrate that is heavily-doped with n-type impurities (i.e., an n+ silicon carbide substrate). A lightly-doped n-type (n−) silicon carbide drift layer 320 is provided on the substrate 310. Upper portions of the n-type silicon carbide drift layer 320 may be doped p-type by, for example, ion implantation, to form silicon carbide p-wells 330. Heavily-doped (n+) n-type silicon carbide regions 340 may be formed in upper portions of the silicon carbide p-wells 330. The n-type regions 340 may be formed by ion implantation. The heavily-doped (n+) n-type silicon carbide regions 340 act as source regions for the device 300. The drift layer 320 and the substrate 310 together act as a common drain region for the device 300. The n-type substrate 310, the n-type drift layer 320, the p-wells 330, and the n-type source regions 340 formed therein may together comprise a semiconductor layer structure 350 of the device 300.

A gate dielectric layer 360 may be formed on the upper surface of the semiconductor layer structure 350. The gate dielectric layer 360 can be any stable dielectric with a bandgap approximately 2 eV larger than the semiconductor underneath. The gate dielectric layer 360 can be a multilayer material stack or a single dielectric compound or alloy. The gate dielectric layer 360 may comprise, for example, a silicon dioxide ($SiO_2$) layer, although other insulating materials, such as $SiO_xN_y$, $Si_xN_y$, $Al_2O_3$ and/or high-K dielectrics such as hafnium oxide, and the like may be used. A gate electrode 370 is formed on the gate dielectric layer 360 opposite the semiconductor layer structure 350. The gate electrode 370 may include, for example, a silicide, doped polycrystalline silicon (poly-Si), and/or a stable conductor. A channel region 332 is provided in the upper portion of p-well 330 between the source region 340 and the portion of the drift layer 320 that is directly underneath the gate dielectric layer 360. As shown in FIG. 4, the gate dielectric layer 360 surrounds the gate electrode 370. Moreover, the lower edges of the sidewalls of the gate electrode 370 are rounded so that the gate dielectric layer 360 is thicker underneath the periphery of the lower surface of the gate electrode 370.

A dielectric isolation pattern 380 is formed on the gate electrode 370, and source metallization 390 is formed on the dielectric isolation pattern 380 and on the exposed source regions 340. A drain contact (not shown) may be provided on the lower surface of the substrate 310 opposite the drift layer 320.

As shown in FIG. 4, a periphery of a portion of the gate dielectric layer 360 that underlies the gate electrode 370 (i.e., the portion under the rounded lower corners of the of the gate electrode) is thicker than a central portion of the gate dielectric layer 360. The thicker portion of the gate dielectric layer may overlie the source region 340, so that the portion of the gate dielectric layer 360 that overlies the source region 340 is thicker than the portion of the gate dielectric layer 360 that overlies the channel region 332. The portion of the gate dielectric layer 360 that overlies the channel region 332 may have a constant thickness. Moreover, the lower surface of the gate dielectric layer 360 may be substantially flat in some embodiments due to the low oxidation properties of silicon carbide. Additionally, the lower surface of the gate electrode has recessed (here rounded) outer edges.

The semiconductor layer structure 350 of FIG. 4 is merely an example, and other configurations of the semiconductor layer structure 350 may be used without deviating from the embodiments described herein. For example, the embodiments described herein may be utilized in semiconductor devices which are gate-controlled, including semiconductor layer structures 350 that are controlled by gate electrodes utilizing a metal-oxide and/or metal-insulator interface, such as a MOSFET, MISFET, or an IGBT device, to name a few. Thus, it will be understood that the semiconductor layer structure 350 can take multiple other forms without deviating from the embodiments described herein.

It will be appreciated that the above description is of an n-type MOSFET. In p-type devices, the locations of the source and drain contacts may be reversed, and the conductivity types of the other n- and p-type regions may be swapped. Accordingly, the source region 340 can be referred to as a "source/drain region" 340.

As discussed above, pursuant to embodiments of the present invention, an oxidation and/or nitridation anneal may be performed during device fabrication that is used to convert a portion of the silicon gate electrode into a dielectric material. In the embodiment of FIG. 4, this oxidation/nitridation anneal is performed after the gate electrode 370 and gate dielectric layer 360 are formed, but before formation of the dielectric isolation pattern 380.

FIGS. 5A through 5D are schematic cross-sectional views illustrating a method for fabricating the MOSFET 300 of FIG. 4.

Figure 5A:
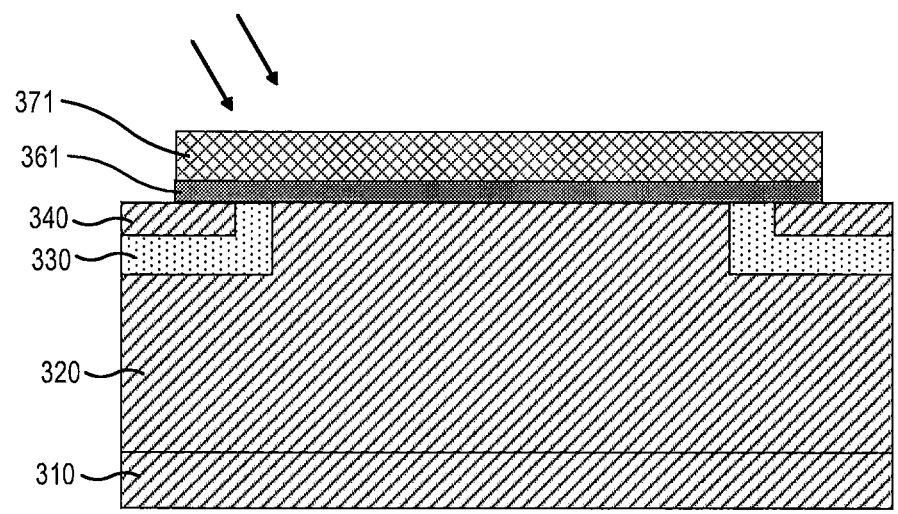
FIGS. 5A through 5D are schematic cross-sectional views illustrating a method for fabricating the MOSFET of FIG. 4.

Referring to FIG. 5A, the semiconductor layer structure 350 may be formed. For example, a heavily-doped ($n^+$) n-type silicon carbide substrate 310 is provided and a lightly-doped ($n^−$) silicon carbide drift layer 320 is formed on the substrate 310 via epitaxial growth. While not shown, in some embodiments, an n-type silicon carbide current spreading layer may be formed that comprises the upper portion of the drift layer 320. Silicon carbide p-wells 330 are formed in upper portions of the drift layer 320 by, for example, ion implantation. Heavily-doped ($n^+$) n-type silicon carbide source/drain regions 340 are then formed in upper portions of the p-wells 330 by, for example, ion implantation. A gate dielectric layer (not shown) and a gate electrode layer (not shown) are then formed sequentially on the upper surface of the semiconductor layer structure 350. The gate dielectric layer and the gate electrode layer are then patterned and etched to form an initial gate dielectric layer 361 and an initial gate electrode 371. The entire structure is then annealed in an atmosphere that includes oxygen and/or nitrogen.

For a silicon-based gate electrode, the anneal may be performed at a anneal chamber temperature of, for example, 750° C. to 850° C. for a slow oxidation, and the duration of the anneal may be from, for example, 5 minutes to 5 hours. In other example embodiments, the anneal chamber temperature may be higher (e.g., 850-950° C.) and the anneal duration may be shortened (e.g., to between 1-60 minutes), which may provide faster oxidation and/or a thicker oxide region. If the oxidizing or reactant pressure is less than 1 atmosphere, then the above listed anneal times may be increases. Longer anneals at lower pressures (e.g., less than 1 atmosphere) may offer more precise control of the amount of oxidation that occurs.

Figure 5B:
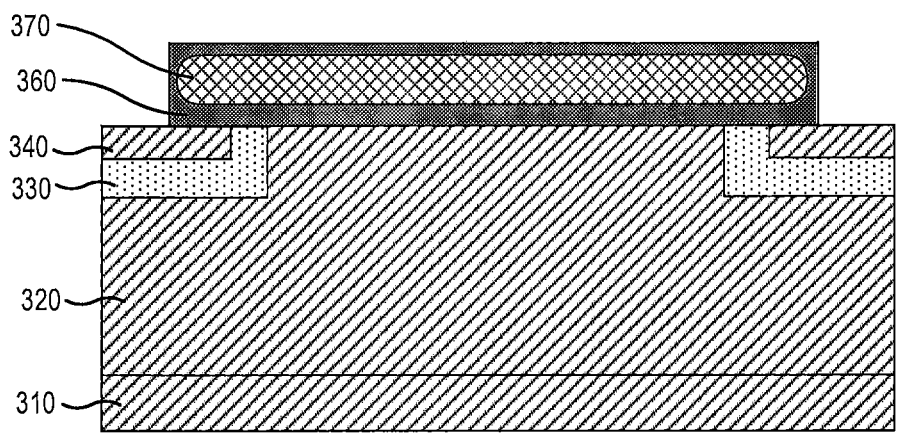

Referring to FIG. 5B, the anneal converts a portion of the initial gate electrode 371 into dielectric material such as silicon oxide, silicon nitride or silicon oxynitride. Thus, the anneal converts the initial gate dielectric layer 361 into the gate dielectric layer 360 and the initial gate electrode 371 into the gate electrode 370. In particular, the oxidation of portions of the initial gate electrode 371 effectively cause the initial gate dielectric layer 361 (which here is a silicon oxide layer) to effectively grow or enlarge into the gate dielectric layer 360. Notably, silicon carbide has a very low rate of oxidation as compared to silicon. Thus, as shown in FIG. 5B, the silicon initial gate electrode 371 will oxidize much faster than will exposed surfaces of the silicon carbide semiconductor layer structure 350. Since only limited oxidation of the initial gate electrode 371 is desired, the net result is that during the anneal the exposed upper surface of the silicon carbide semiconductor layer structure 350 is effectively not oxidized at all, as shown in FIG. 5B. As can be seen in FIG. 5B, the exposed regions of the initial gate electrode 371 oxidize, so that the intersections of the top surface of the initial gate electrode 371 and the sidewalls thereof oxidize, thereby forming a dielectric over the top surface and sidewalls of the resultant gate electrode 370. Likewise, the intersections of the bottom surface of the initial gate electrode 371 and the sidewalls thereof become rounded. The lower portion of the initial gate electrode 371 that oxidizes along with the initial gate dielectric layer 361 together form the resultant gate dielectric layer 360. As can be seen in FIG. 5B, the portions of the gate dielectric layer 360 that overlie the source regions 340 are thickened, particularly at the outer periphery, which may dramatically improve the breakdown performance of MOSFET 300 as compared to the conventional MOSFET 200 discussed above with reference to FIG. 3 (see discussion above). Additionally, the portions of the gate dielectric layer 360 that overlie the p-type wells 330, which are where the channels 332 of the MOSFET 300 are formed, maintain a constant thickness as the oxidation does not extend that far underneath the gate electrode 370. Ensuring that the gate dielectric layer 360 has a relatively constant thickness over each channel 332 may ensure that the performance of the MOSFET 300 is not compromised.

While the above discussion assumed that an oxidation anneal was used to round the intersections of the sidewalls and bottom surface of the gate electrode 370, it will be appreciated that embodiments of the present invention are not limited thereto. In other embodiments, a nitridation anneal may be performed instead of or in addition to an oxidation anneal, or an anneal may be performed in a mixed oxygen and nitrogen containing environment. In example embodiments of the present invention, the anneal may be performed in any of the following environments: air, $O_2$, diluted $O_2$, ozone ($O_3$), moisture ($H_2O$), $N_2$, $NH_3$, $N_2O$ or NO. If the anneal is performed in an environment that includes oxygen but that does not include nitrogen, the exposed surfaces of the silicon gate electrode 370 will be converted to silicon oxide ($SiO_2$). If the anneal is performed in an environment that includes nitrogen but that does not include oxygen, the exposed surfaces of the silicon gate electrode 370 will be converted to silicon nitride. If the anneal is performed in an environment that includes both oxygen and nitrogen, the exposed surfaces of the silicon gate electrode 370 will be converted to a silicon oxide/nitride mixture.

Figure 5C:
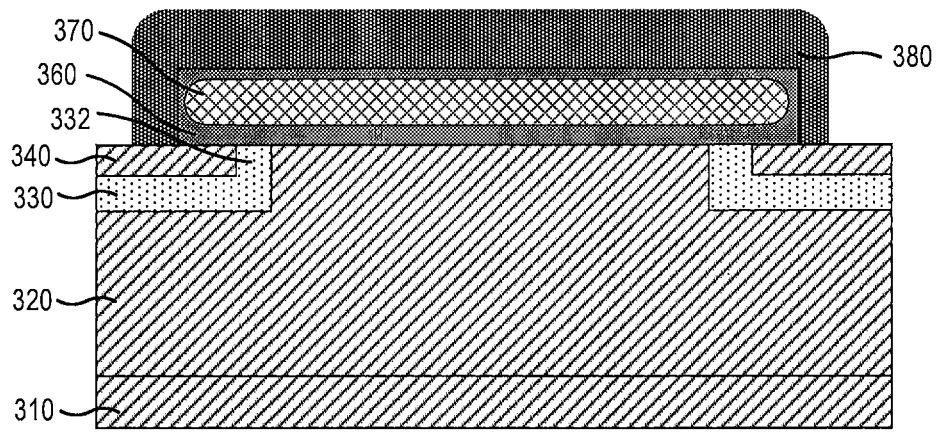
Figure 5D:
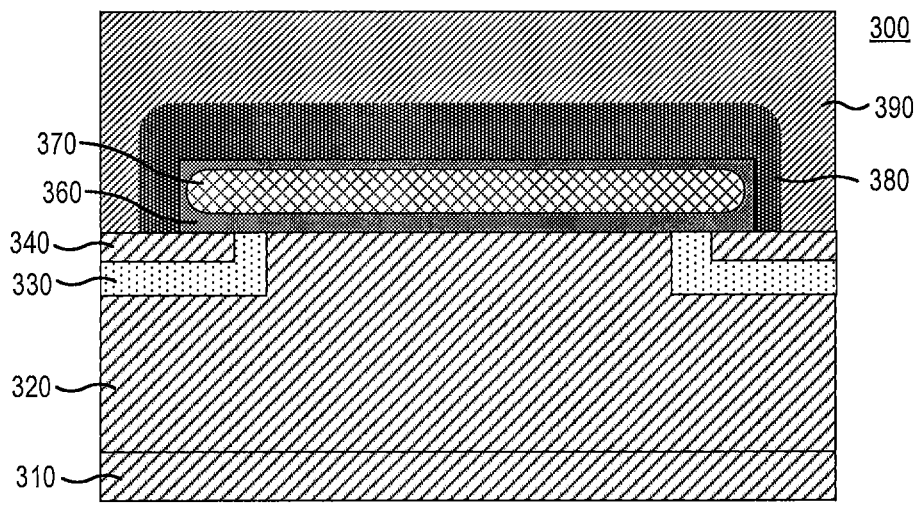

Referring to FIG. 5C, a dielectric isolation layer (not shown) is formed that may comprise for example, a multilayer or single layer dielectric layer. In an example embodiment, the dielectric isolation layer may comprise a multilayer structure including silicon oxide and phosphorous silicate glass. The dielectric isolation layer is then patterned to expose the source regions to form the dielectric isolation pattern 380 shown in FIG. 5C. Finally, source metallization 390 may then be formed to cover the dielectric isolation pattern and to contact the source regions 340 to provide the MOSFET 300, as shown in FIG. 5D.

Figure 6A:
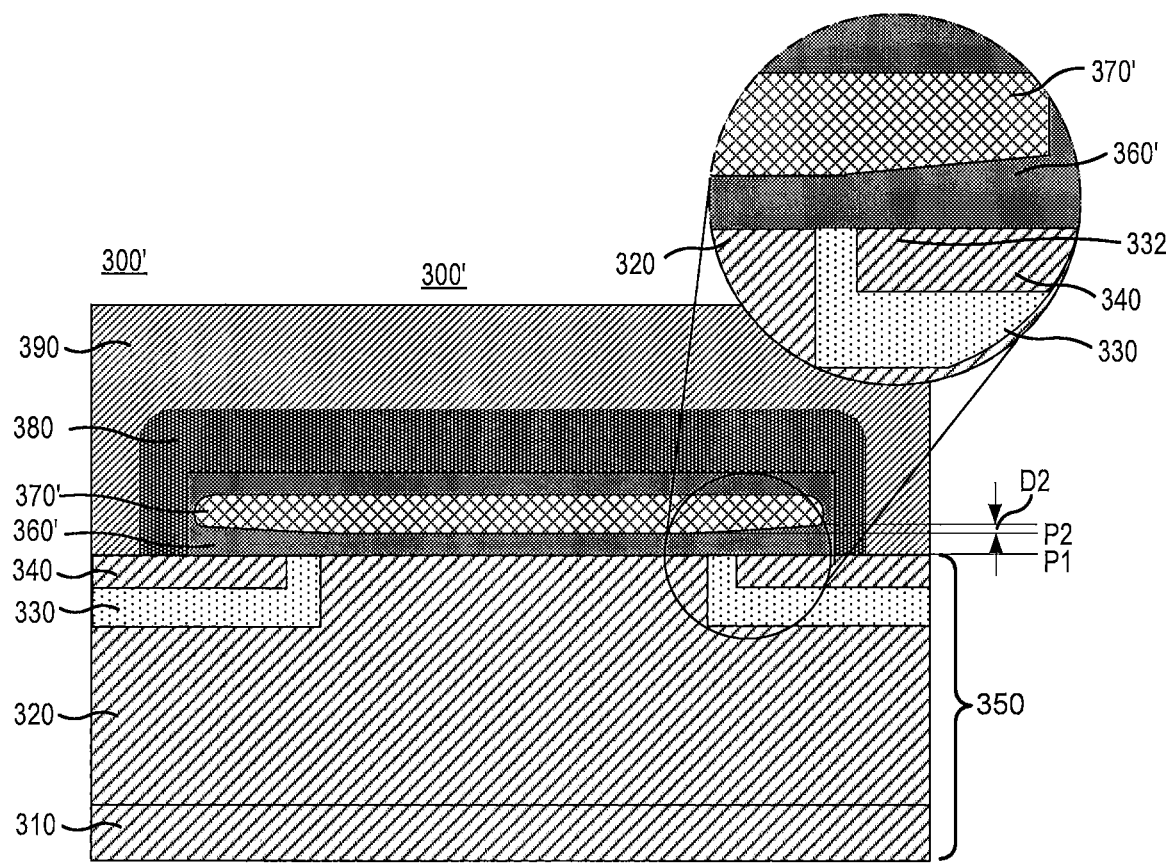
FIG. 6A is a schematic cross-sectional view of a MOSFET according to embodiments of the present invention in which a more aggressive oxidation anneal is performed.

FIG. 6A is a schematic cross-sectional view of a MOSFET 300' according to embodiments of the present invention that is a modified version of the MOSFET 300 of FIG. 4. The difference between MOSFETs 300 and 300' is that a more aggressive oxidation and/or nitridation anneal is performed during the fabrication of MOSFET 300', meaning that the anneal is performed at a higher temperature, for a longer duration, and/or in an environment that includes more oxygen/nitrogen so that a larger portion of the initial gate electrode 371 converted to a dielectric material. When a more aggressive anneal is performed (here we will assume that the anneal is an oxidation anneal), the upper surface of the initial gate electrode 371 tends to oxidize uniformly except at the edges where more oxidation takes place. Since the lower surface of the initial gate electrode 371 is not exposed, the degree of oxidation decreases with increasing distance from the sidewalls of the initial gate electrode 371, resulting in a gate electrode 370' having a recess in the form of a bevel around the lower periphery thereof (i.e., the lower surface has a beveled outer edge) and a gate dielectric layer 360'.

In some embodiments, a lower surface of the central portion of the gate dielectric layer 360' defines a first plane P1 that is parallel to a bottom surface of the semiconductor layer structure 350 and an upper surface of the central portion of the gate dielectric layer 360' defines a second plane P2 that is parallel to the bottom surface of the semiconductor layer structure 350. A first distance (not visible in FIG. 6A since there is essentially no oxidation of the silicon carbide semiconductor layer structure 350) between the first plane P1 and a lower surface of the periphery of the portion of the gate dielectric layer 360' that underlies the gate electrode 370' is less than half a second distance D2 between the second plane P2 and an upper surface of the periphery of the portion of the gate dielectric layer 360' that underlies the gate electrode 370'.

Figure 6B:
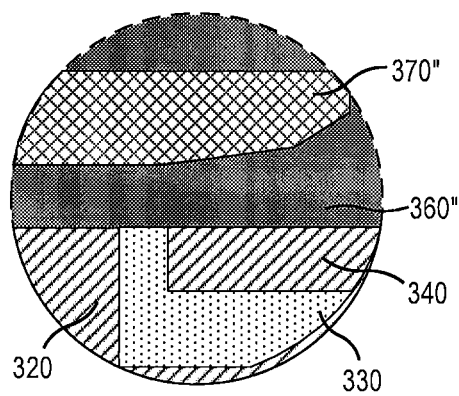
FIGS. 6B and 6C are enlarged, partial schematic cross-sectional views of two modified versions of the MOSFET of FIG. 6A.

While the MOSFET 300' of FIG. 6A includes a single bevel, it will be appreciated that gate electrodes 370" having multiple bevels in the periphery of the lower surface thereof may be provided in other embodiments, as is shown in FIG. 6B, which is a callout similar to the callout included in FIG. 6A of a MOSFET that includes such multiple bevels.

Figure 6C:
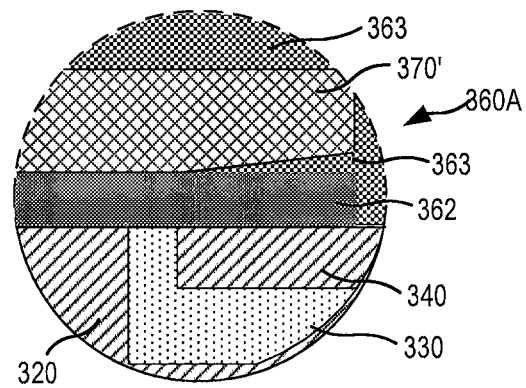

As discussed above, in some embodiments, the anneal may be performed in a nitrogen environment. If the initial gate electrode 371 is a silicon gate electrode, and the initial gate dielectric layer 361 is a silicon oxide layer, then an anneal in a nitrogen environment will form a final gate dielectric layer 360A that includes two different materials. In particular, as shown in FIG. 6C, which is a callout similar to the callout included in FIG. 6A, the nitrogen anneal converts the upper surface, sidewalls, and the periphery of the lower surface of the initial gate electrode 371 into a silicon nitride layer 363. Thus, the final gate dielectric layer 360A in such an embodiment includes a silicon oxide layer 362 and the silicon nitride layer 363. The silicon nitride layer 363 is located between the gate electrode 370' and the silicon oxide layer 362. The silicon nitride layer 363 includes an uppermost region of the periphery of the portion of the gate dielectric layer 360A that underlies the gate electrode 370'.

Figure 7A:
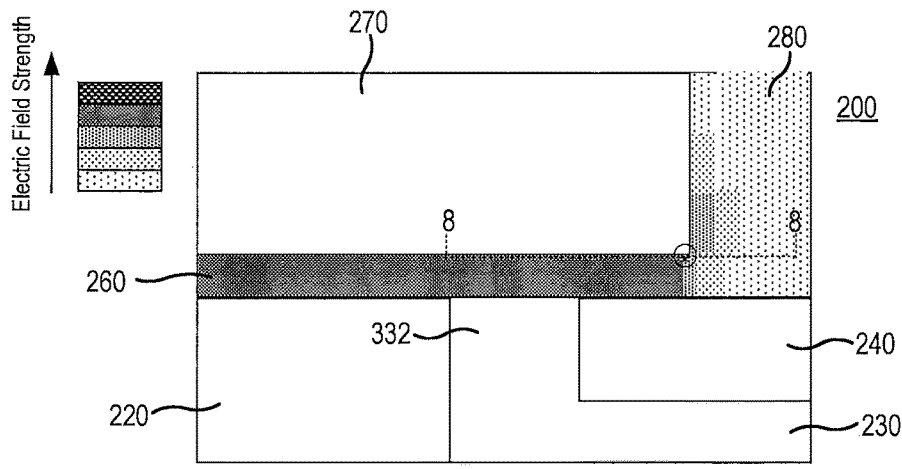
FIGS. 7A and 7B are enlarged cross-sectional views of the MOSFETs of FIGS. 3 and 6A, respectively, that illustrate the electric field strengths in the gate dielectric layers thereof.
Figure 7B:
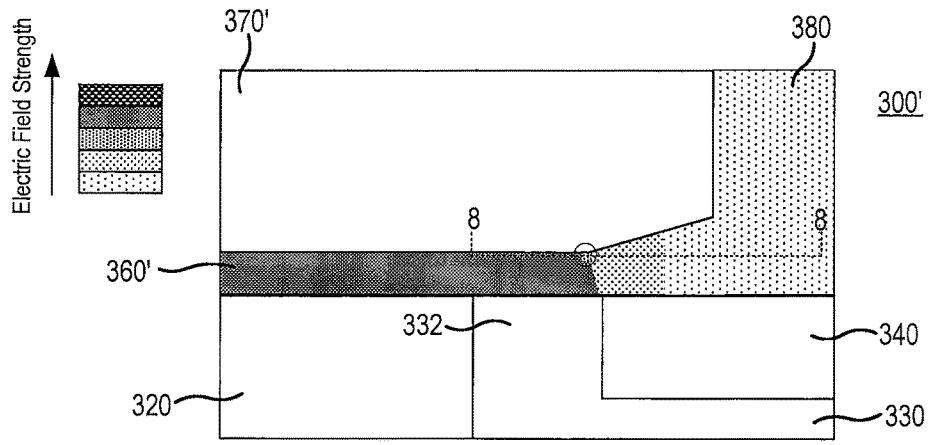

FIGS. 7A and 7B are enlarged cross-sectional views of the MOSFETs 200 and 300' of FIGS. 3 and 6A, respectively, that illustrate the electric field strengths in the gate dielectric layers 260, 360' thereof. In FIGS. 7A and 7B, the different fill patterns indicate different electrical field strengths in the gate dielectric layer, with the legend showing the relative values of the different shadings included in the figures.

As shown in FIG. 7A, the electric field strength in the gate dielectric layer 260 of the conventional MOSFET 200 is relatively constant at a first level, but is much higher at the upper outside corner (the location where the peak electric field occurs is circled in FIG. 7A). This peak electric field value may, for example, be at least 20% higher than the electric field value throughout the remainder of the gate dielectric layer 260. As can also be seen from FIG. 7A, the location where the peak electric field value occurs is above the source region 240, and hence may quickly result in a short circuit between the gate electrode 270 and the source region 240 once breakdown begins to occur.

As shown in FIG. 7B, the beveled lower edge of the gate electrode 370' of MOSFET 300' dramatically changes the electric field distribution in the gate electrode dielectric layer 360' as compared to the gate dielectric layer 260 of MOSFET 200. In particular, the location of the peak electric field strength is spaced inwardly from a sidewall of the gate electrode (i.e., toward the center of the gate dielectric layer 360'), and the peak electric field value is reduced. In some embodiments, the location in the gate dielectric layer 360 where the peak electric field value occurs may be spaced inwardly from the sidewall of the gate electrode by at least 0.05 microns, at least 0.1 microns, at least 0.2 microns or at least 0.4 microns. In some embodiments, during on-state operation, the peak electric field value in the gate dielectric layer may be located substantially above an outer sidewall (i.e. a sidewall closest to the source region 340) of the channel region 332, as shown in FIG. 7B (the location where the peak electric field occurs is also circled in FIG. 7B).

Additionally, the thickness of the gate dielectric layer 360' in the region between the gate electrode 370' and the source region 340 is increased due to the conversion of part of the lower surface of the initial gate electrode 371 into dielectric material by the anneal. The increased thickness of the gate dielectric layer 360' may increase the time to breakdown, as a greater amount of dielectric material must degrade before a short circuit is formed between the gate electrode 370' and the source region 340. Additionally, moving the location where the peak electric field value occurs so that it is approximately above the interface between the source region 340 and the channel region 332 also may extend the time to breakdown, especially as the fields may be lower in the gate dielectric layer 360' that is above the source region 340. The reduction in the peak electric field value generated in the gate dielectric layer 360' for a given gate voltage also acts to increase the time to breakdown. Finally, the electric field values in the portion of the dielectric isolation pattern that is adjacent the gate electrode 370' are also reduced, mitigating another potential breakdown mechanism. Thus, the MOSFET 300' of FIG. 6A may have a significantly longer lifetime in terms of gate dielectric breakdown than the conventional MOSFET 200 of FIG. 3.

Figure 8:
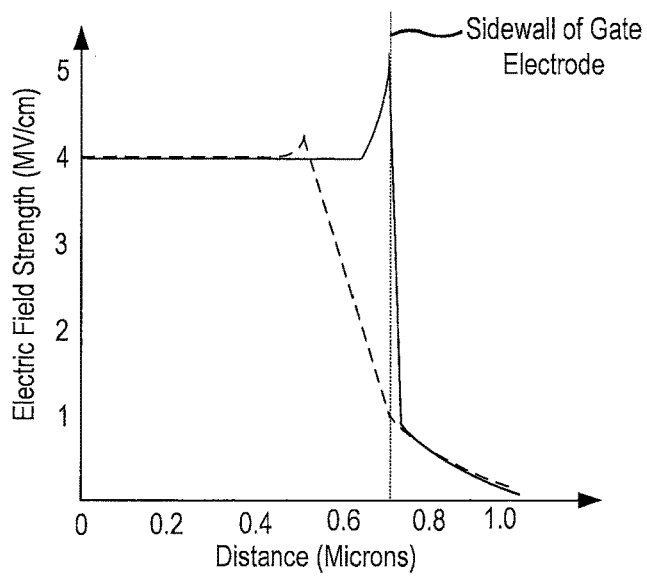
FIG. 8 is a graph showing the electric field strengths in the gate dielectric layers of the MOSFETs of FIGS. 7A and 7B, respectively, where the electric field strength is measured along lines 8-8 in FIGS. 7A and 7B.

FIG. 8 is a graph showing the electric field strength in the gate dielectric layers of the MOSFETs of FIGS. 7A and 7B, where the electric field strength is measured along lines 8-8 in FIGS. 7A and 7B. FIG. 8 more clearly show the effects discussed above with reference to FIGS. 7A and 7B. In particular, as shown by the solid curve in FIG. 8, the electric field strength in the gate dielectric layer of the conventional MOSFET 200 of FIG. 3 is about 4 MV/cm, but underneath the edge of the gate electrode 270 (i.e., at the upper edge of the gate dielectric layer 260) the electric field strength spikes to over 5 MV/cm. The electric field strength in the dielectric isolation pattern 380 that abuts the gate dielectric layer drops rapidly from this peak to very low levels, as shown at the right side of the solid curve.

In contrast, the dashed curve in FIG. 8 shows that the electric field strength in the gate dielectric layer of the MOSFET 300' according to embodiments of the present invention is again about 4 MV/cm. Similar to the solid curve, the dashed curve includes a spike in the electric field strength that then quickly tapers off, but in the dashed curve the spike is much smaller (to about 4.2 MV/cm) and is located farther underneath from the edge of the gate electrode 370'. These differences result in improved breakdown performance for MOSFET 300' as compared to MOSFET 200.

Thus, as shown in FIG. 8, the semiconductor devices according to embodiments of the present invention may be configured so that during on-state operation a peak electric field value in the gate dielectric layer 360 will be within 5%, 8%, 10%, 12% or 15% of a value of the electric field at the upper surface of the gate dielectric layer 360 under a center portion of the lower surface of the gate electrode 370. The center portion of the lower surface of the gate electrode 370 has a substantially constant electric field value during on-state operation.

As discussed above, in some embodiments, the anneal according to embodiments of the present invention may be performed in an environment that includes nitrogen. The silicon nitride layer that is formed during this anneal may act as a passivation layer that may be used to eliminate electronically active interface states at the interface between the gate dielectric layers 360, 360' and the channel regions 332. The nitrogen may also enhance oxidation, and hence may provide for higher oxidation rates underneath the periphery of the gate electrodes 370, 370' without causing oxidation under the central portion of the gate electrode (including the portions of the gate electrodes 370, 370' that overlie the channels 332). Thus, by including nitrogen in the anneal, the properties of the gate dielectric layers 360, 360' may be improved, and since the nitrogen does not extend all of the way underneath the gate electrode, various adverse effects that can occur when nitrogen is above the JFET region of the device may be avoided.

FIGS. 9A through 9D are schematic cross-sectional views illustrating a method for fabricating a MOSFET 400 according to further embodiments of the present invention.

Figure 9A:
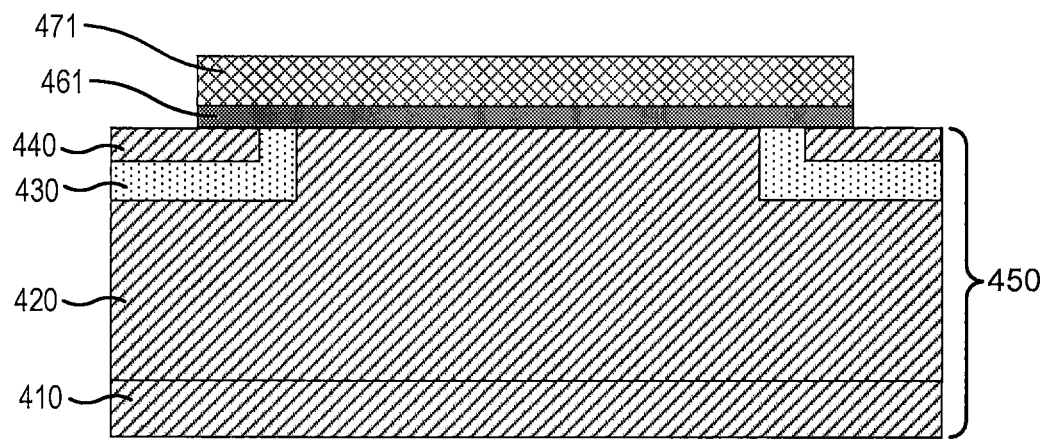
FIGS. 9A through 9D are schematic cross-sectional views illustrating a method for fabricating a MOSFET according to further embodiments of the present invention.

Referring to FIG. 9A, a semiconductor layer structure 450, an initial gate dielectric layer 461 and an initial gate electrode pattern 471 are formed using, for example, the same steps described above to form the semiconductor layer structure 350, the initial gate dielectric layer 361 and the initial gate electrode pattern 371 shown in FIG. 5A. Next, referring to FIG. 9B, a dielectric isolation layer (not shown) is formed to cover the upper surface of the semiconductor layer structure 450, the initial gate dielectric layer 461 and the initial gate electrode 471. The dielectric isolation layer is then patterned to provide, for example, a dielectric isolation pattern 480 that may be identical to the dielectric isolation pattern 380 discussed above with reference to FIG. 5C.

Figure 9B:
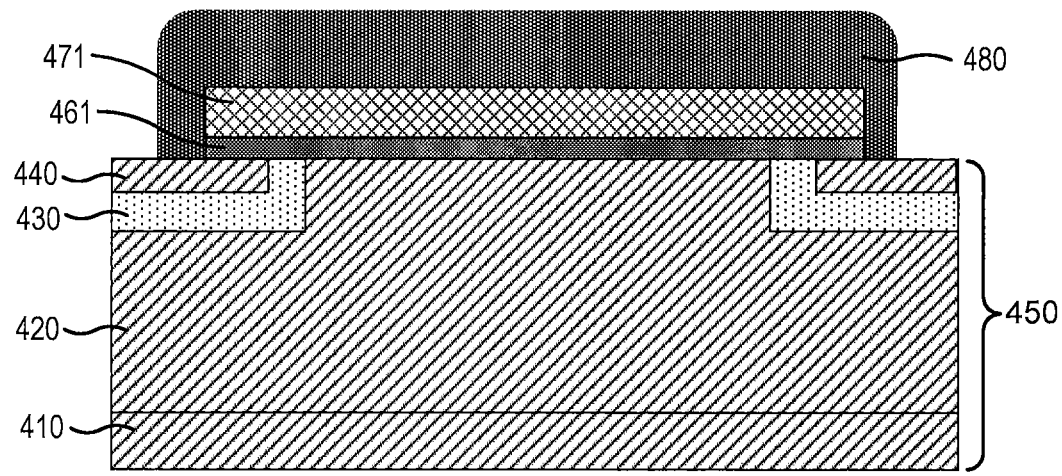
Figure 9C:
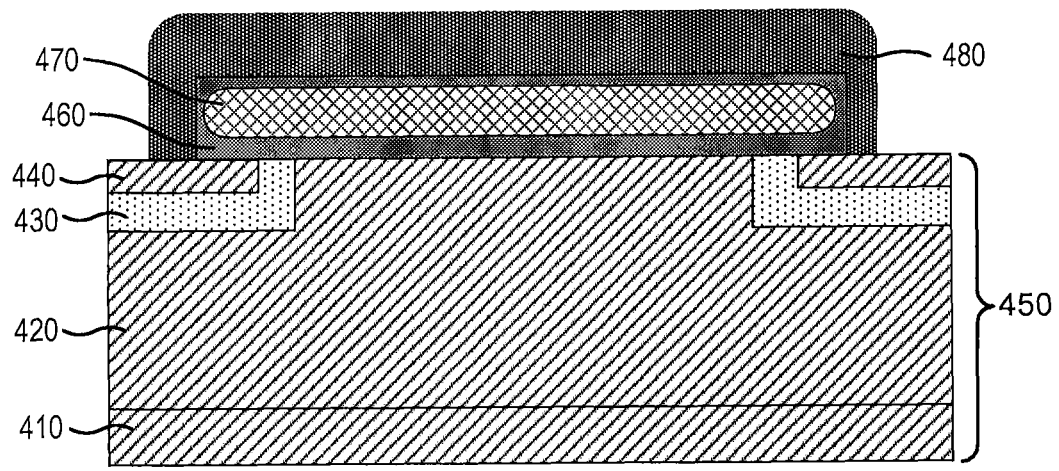

Referring to FIG. 9C, the structure of FIG. 9B is then annealed in an atmosphere that includes oxygen and/or nitrogen. The anneal may be under, for example, the conditions described above with reference to FIG. 5A. The anneal converts a portion of the initial gate electrode 471 into dielectric material such as silicon oxide, silicon nitride or silicon oxynitride.

For the example shown in FIGS. 9A-9D, it is assumed that the anneal is performed in an oxygen environment so that the portions of the initial gate electrode 471 that are converted to a dielectric material are converted to silicon oxide, and hence the oxidation of portions of the initial gate electrode 471 cause the initial gate dielectric layer 461 (which here is a silicon oxide layer) to effectively grow or enlarge into gate dielectric layer 460, while the initial gate electrode 471 shrinks in size to become gate electrode 470. As shown in FIG. 9C, the upper surface and sidewalls of the initial gate electrode 471 are oxidized during the anneal, as are the lower corners/sidewalls of the initial gate electrode 471, which results in the gate electrode 470 having sidewalls with rounded profiles.

Figure 9D:
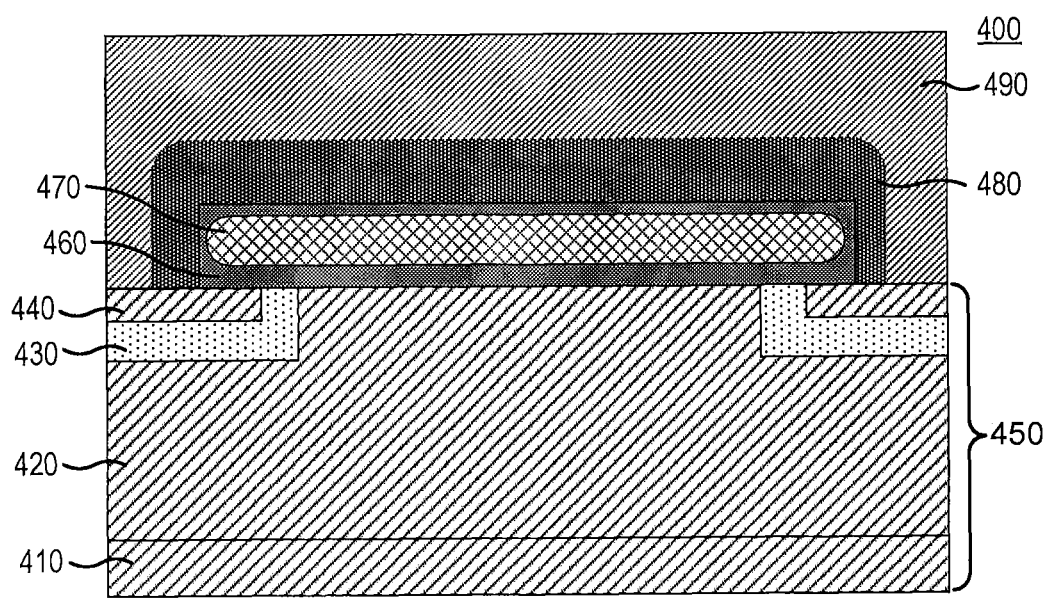

Finally, as shown in FIG. 9D, source metallization 490 may then be formed to cover the dielectric isolation pattern 480 and to contact the source regions 440.

By performing the oxidation/nitridation anneal after forming the dielectric isolation pattern 480, the anneal may act to densify the dielectric material of the dielectric isolation pattern 480. This may help reduce the possibility of a dielectric breakdown path forming through the dielectric isolation pattern 480. Additionally, the presence of the dielectric isolation pattern 480 slows the oxidation and/or nitridation rate of the silicon initial gate electrode 471, which allows for more precise process control. This may make it possible to more repeatedly convert a portion of the lower surface of the initial gate electrode 471 that overlies the source region 440 into a dielectric material while avoiding converting the portion of the lower surface of the initial gate electrode 471 that overlies the channel region into a dielectric material.

Figure 10A:
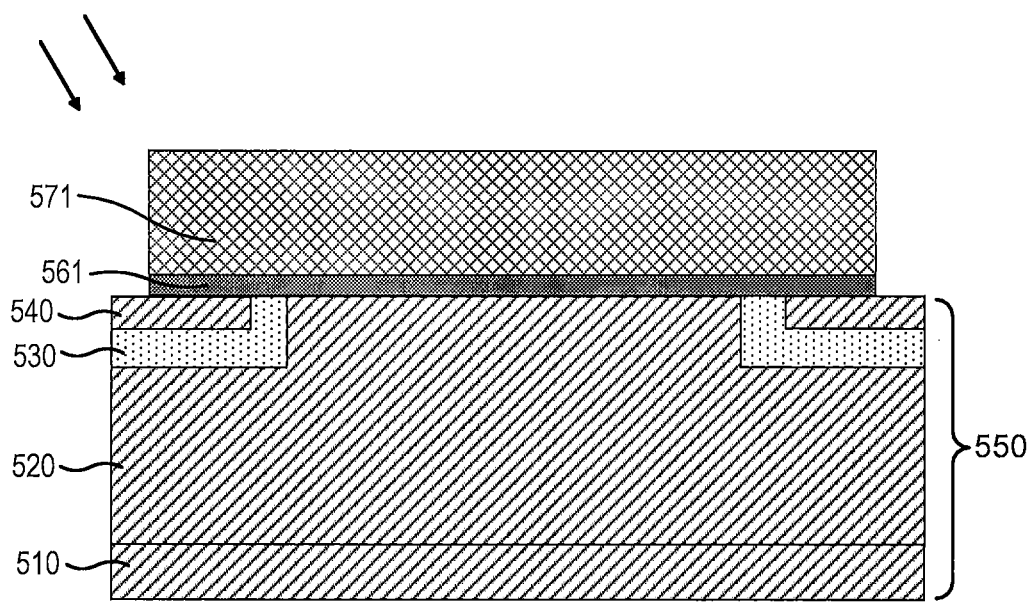
FIGS. 10A through 10C are schematic cross-sectional views illustrating a method for fabricating a MOSFET according to still further embodiments of the present invention.
Figure 10B:
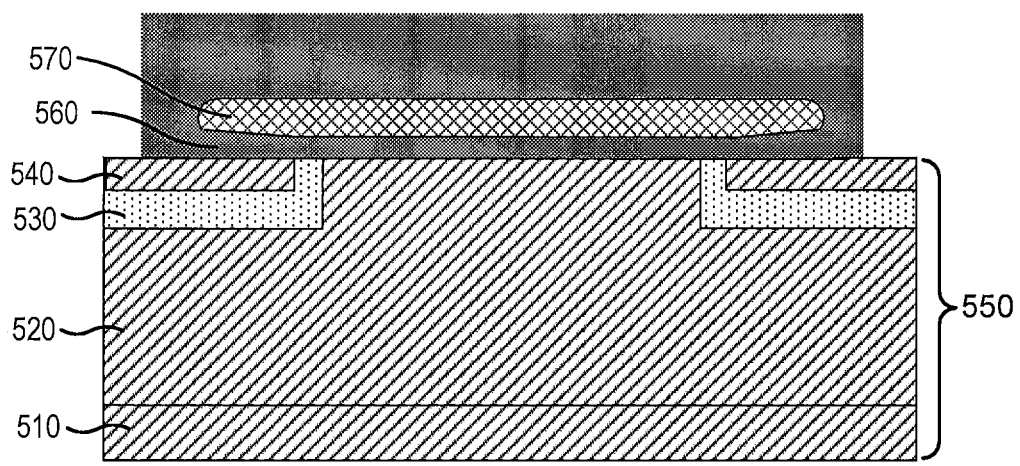
Figure 10C:
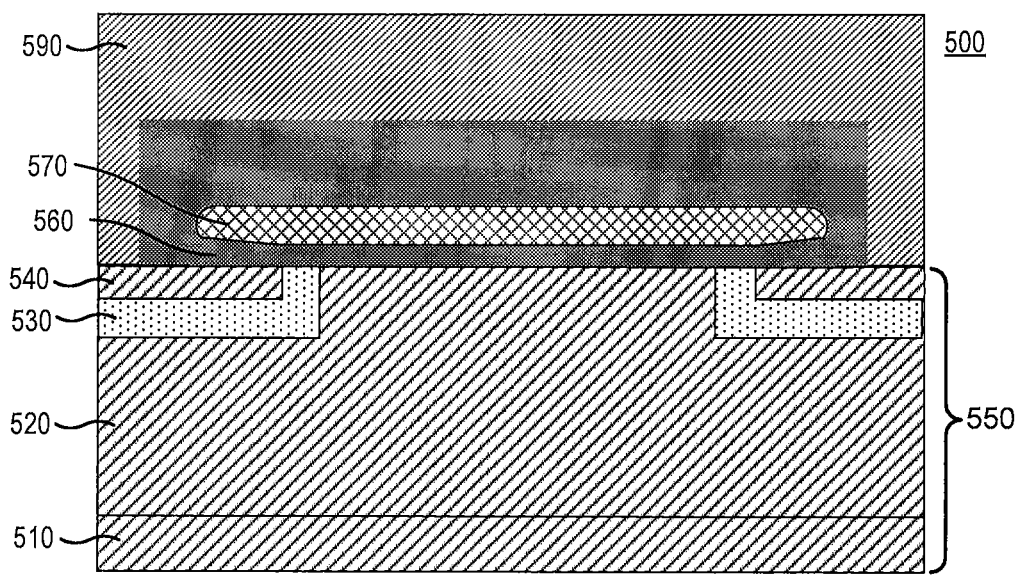

FIGS. 10A through 10C are schematic cross-sectional views illustrating a method for fabricating a MOSFET 500 according to still further embodiments of the present invention.

Referring to FIG. 10A, a semiconductor layer structure 550 is formed using, for example, the same steps described above to form the semiconductor layer structure 350 shown in FIG. 8A. A gate dielectric layer (not shown) and a gate electrode layer (not shown) are then formed sequentially on the upper surface of the semiconductor layer structure 550. Here, the gate electrode layer is formed to be much thicker (e.g., at least 2-3 times as thick or more) as compared to the gate electrode layers that are formed in the embodiments discussed above with reference to FIGS. 5A-5D and 9A-9D. The gate dielectric layer and the gate electrode layer are then patterned and etched to form an initial gate dielectric layer 561 and an initial gate electrode 571. The entire structure is then annealed in an atmosphere that includes oxygen and/or nitrogen. The anneal may be performed for a longer period of time and/or at a higher temperature as compared to the anneal described above with reference to FIG. 5A.

As shown in FIG. 10B, the anneal converts much of the initial gate electrode 571 into dielectric material such as silicon oxide, silicon nitride and/or silicon oxynitride. For the example shown in FIGS. 10A-10C, it is assumed that the anneal is performed in an oxygen environment so that the portions of the initial gate electrode 571 that are converted to a dielectric material are converted to silicon oxide, and hence the oxidation of portions of the initial gate electrode 571 effectively cause the initial gate dielectric layer 561 (which here is a silicon oxide layer) to grow or enlarge to provide the gate dielectric layer shown in FIG. 10B, and the initial gate electrode 571 is correspondingly reduced in size to form the gate electrode 570. Since a large portion of the initial gate electrode 571 is converted to silicon oxide, a separate dielectric isolation pattern may be omitted. Referring to FIG. 10C, source metallization 590 may then be formed to cover the gate dielectric layer 560 to provide the MOSFET 500.

One advantage of the approach of FIGS. 10A-10C is that the extended anneal performed on the initial gate electrode 571 may result in formation of a thick, dense dielectric pattern on the top and side surfaces of the gate electrode 570. As discussed in U.S. patent application Ser. No. 16/413,921, filed May 16, 2019, the entire content of which is incorporated herein by reference, wet etchants or other corrosive materials may migrate along grain boundaries through the source metallization, particularly if keyholes or other defects are present in the upper surface of the source metallization. Even if the source metallization includes a diffusion barrier layer, it sometimes is possible for the wet etchants to seep through voids or passageways in the diffusion barrier layer and attack the dielectric isolation pattern. If the thickness of the dielectric isolation pattern is insufficient, a portion of the dielectric isolation pattern may be completely dissolved by the wet etchants, and the source metallization may short circuit to the gate electrode, which results in device failure.

As shown in the figures herein, the dielectric isolation pattern typically has rounded corners or even a fully rounded top surface that results from reflow of the dielectric isolation pattern during subsequent high temperature processes. As a result, the location where the dielectric isolation pattern has a minimum thickness (i.e., the location where minimum amount of dielectric isolation pattern separates the gate electrode from the source metallization) in conventional devices typically is adjacent the upper corners and sidewalls of the gate electrode. However, when the technique discussed above with respect to FIGS. 10A-10C is used, the dielectric isolation pattern formed on the sidewalls and upper surface of the gate electrode by the anneal may have less rounded upper corners and sidewalls, thereby increasing the minimum thickness of the dielectric isolation pattern. Additionally, since the intersections of the upper surface and sidewalls of the initial gate electrode will convert to dielectric material more quickly as compared to, for example, the remainder of the upper surface and sidewall (since at these intersections the initial gate electrode is being oxidized from two sides), in the gate electrode 570 the intersections of the upper surface and sidewalls are rounded, which increases the minimum thickness of the dielectric isolation pattern. As a result, the overall thickness of the dielectric isolation pattern may be reduced. This may allow increased integration, since the width of the regions between adjacent dielectric isolation patterns often determines how densely the unit cells may be formed to ensure that the source metallization fills into these regions with minimal voids.

Figure 11A:
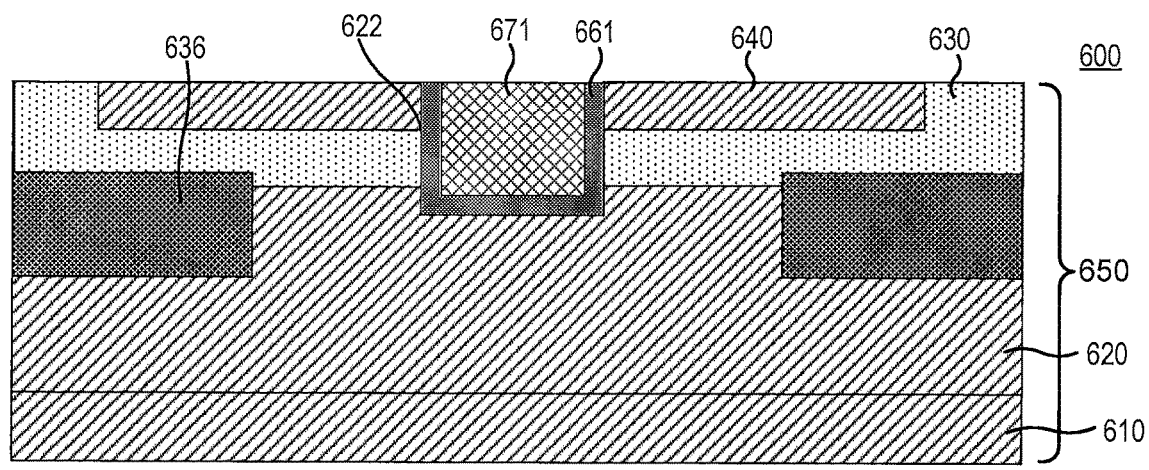
FIGS. 11A and 11B are schematic cross-sectional views explaining fabrication of a MOSFET according to further embodiments of the present invention that has a gate electrode that is formed within a trench.
Figure 11B:
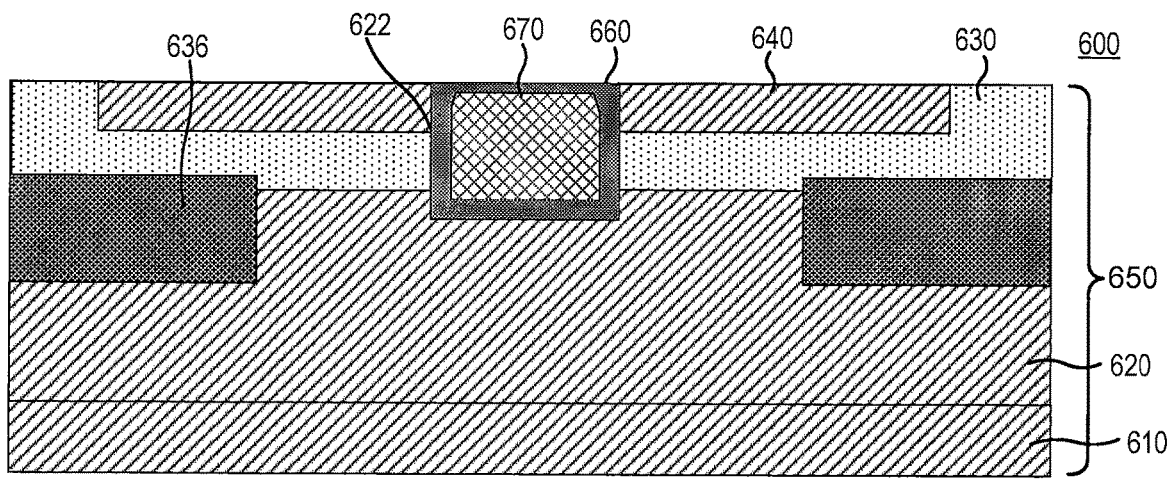

FIGS. 11A and 11B are schematic cross-sectional views explaining fabrication of a MOSFET 600 according to further embodiments of the present invention that has a gate electrode that is formed within a trench in the semiconductor layer structure thereof. Such MOSFETs that have a gate trench are commonly referred to as U-Shaped MOSFET (UMOSFET) devices.

As shown in FIG. 11A, the MOSFET 600 includes a semiconductor layer structure 650 that includes a heavily-doped n-type silicon carbide semiconductor substrate 610, a lightly-doped n-type (n−) silicon carbide drift layer 620, silicon carbide p-type wells 630 and heavily-doped (n+) n-type silicon carbide source regions 640. A trench 622 is formed in the drift layer 620, and an initial gate dielectric layer 661 is formed on the bottom surface and sidewalls of the trench 622. In some embodiments, a bottom surface of the trench 622 may extend below a bottom surface of the wells 630 and/or the source regions 640 into the drift layer 620. An initial gate electrode 671 is formed on the initial gate dielectric layer 661 in the trench 622.

The substrate 610, drift layer 620, well 630, and source regions 640 may be identical to the corresponding regions/layers of MOSFET 300 of FIG. 4, with two exceptions. First, as described above, a trench 622 is formed in the upper surface of the drift layer 620. Second, p-type shield regions 636 may be formed in the drift layer 620. The shield regions

636 may help protect the corners of the final gate dielectric layer 660 (FIG. 11B) from high electric fields during reverse blocking operation. Thus, further discussion of the substrate 610, drift layer 620, well 630, and source regions 640 will be omitted.

An oxidation and/or nitridation anneal is then performed on the device of FIG. 11A. In the specific embodiment described with reference to FIGS. 11A-11B, this anneal is performed prior to formation of the dielectric isolation pattern, but it will be appreciated that in other embodiments the dielectric isolation pattern may be formed prior to the anneal. As shown in FIG. 11B, the anneal acts to convert upper portions of the initial gate electrode 671 into a dielectric material. The net effect is that the upper corners of the initial gate dielectric layer 661 are thickened by the anneal to provide the gate dielectric layer 660 shown in FIG. 11B, and the initial gate electrode 671 is correspondingly reduced in size to provide the gate electrode 670. The conversion of some of the initial gate electrode 671 into dielectric material in order to both change the shape of the gate electrode 670 and to increase the thickness of portions of the gate dielectric layer 660 has the same beneficial effects with respect to the electric field at the upper corners of the gate dielectric layer 660 as the other embodiments discussed above. In particular, the location of the peak electric field value is moved away from the corner of the gate electrode, the peak electric field value adjacent the top of the gate electrode is reduced, and the gate dielectric layer adjacent the top of the gate electrode is thickened.

Figure 12A:
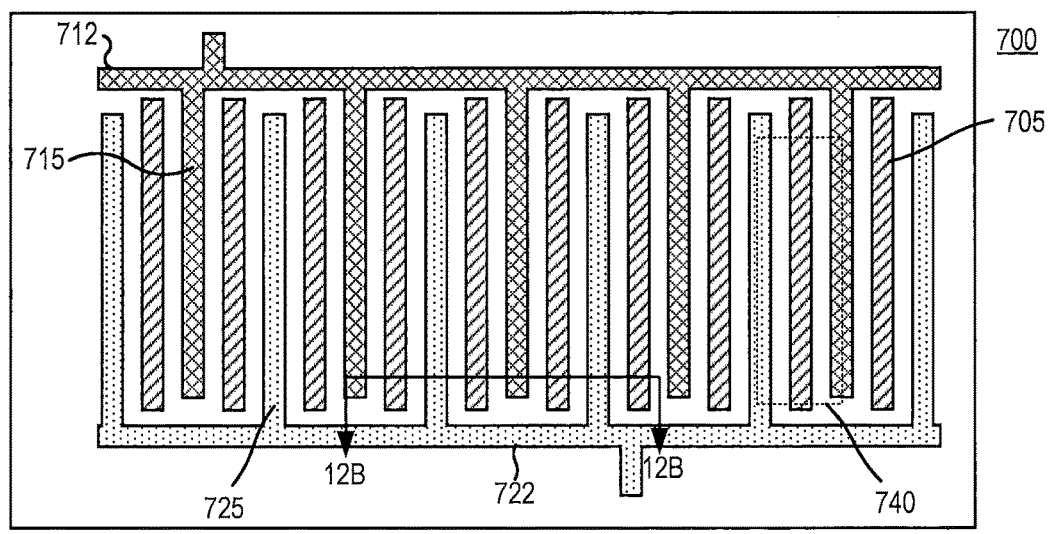
FIG. 12A is a schematic plan view of the gate, source and drain contacts of a gallium nitride based High Electron Mobility Transistor according to further embodiments of the present invention.
Figure 12B:
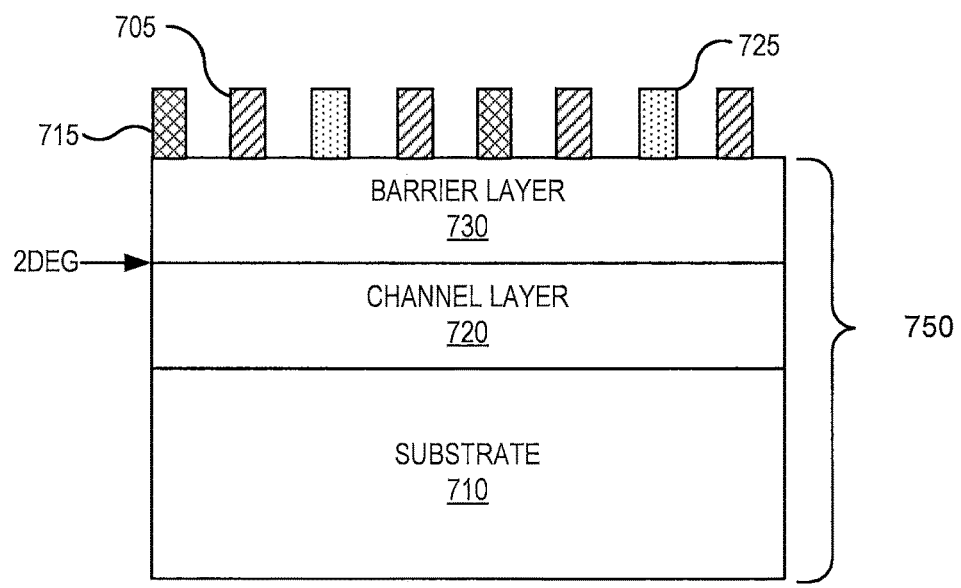
FIG. 12B is a cross-sectional view taken along line 12B-12B of FIG. 12A.
Figure 12C:
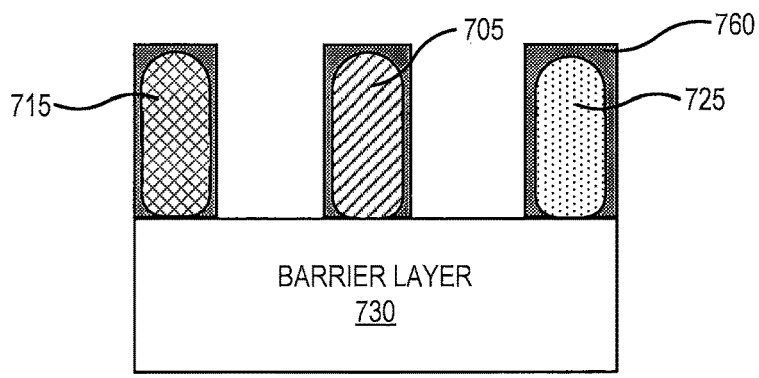
FIG. 12C is an enlarged view of the upper portion of FIG. 12B after an anneal is performed to convert exposed outer surfaces of the gate, source and drain contacts to a dielectric material.

FIGS. 12A-12C schematically illustrate a gallium nitride based High Electron Mobility Transistor ("HEMT") 700 according to further embodiments of the present invention. In particular, FIG. 12A is a schematic plan view of the gate, source and drain contacts of the HEMT 700 (i.e., the portion of the gate, source and drain metallization that contacts the upper surface of the semiconductor layer structure). FIG. 12B is a cross-sectional view taken along line 12B-12B of FIG. 12A. FIG. 12C is an enlarged view of the upper right portion of FIG. 12B after an anneal according to embodiments of the present invention is performed to convert exposed outer surfaces of the gate, source and drain contacts into dielectric material.

Referring first to FIG. 12B, the HEMT 700 includes a substrate 710, which may, for example, be a 4H or 6H silicon carbide substrate. A channel layer 720 is on the substrate 710, and a barrier layer 730 is on the channel layer 720 so that the channel layer 720 is between the substrate 710 and the barrier layer 730. The channel layer 720 and the barrier layer 730 may include Group III-nitride based materials, with the material of the barrier layer 730 having a higher bandgap than the material of the channel layer 720. For example, the channel layer 720 may comprise gallium nitride ("GaN"), while the barrier layer 730 may comprise aluminum gallium nitride ("AlGaN"). The channel layer 720 and/or the barrier layer 730 may comprise multilayer structures in some embodiments, and additional layers (not shown) may be included in the semiconductor layer structure 750.

Source contacts 705 and drain contacts 725 are provided on the barrier layer 730. Gate contacts 715 are provided on the barrier layer 730 between adjacent source and drain contacts 705, 725. The gate contacts 715 may comprise, for example, Ni, Pt, Cu, Pd, Cr, and/or W. The source contacts 705 and drain contacts 725 may include a metal, such as TiAlN, that can form an ohmic contact to GaN.

Due to the difference in bandgap between the barrier layer 730 and the channel layer 720 and piezoelectric effects at the interface between the barrier layer 730 and the channel layer 720, when appropriate bias voltages are applied to the gate, source and drain contacts 715, 705, 725, a two dimensional electron gas (2DEG) is induced in the channel layer 720 at the junction between the channel layer 720 and the barrier layer 730. The 2DEG acts as a highly conductive layer that allows conduction between the source and drain regions of the device where the source region is the portion of the barrier layer 730 under a source contact 705 and the drain region is the portion of the barrier layer 730 under a drain contact 725.

Referring to FIG. 12A, the HEMT 700 further includes a gate bus 712 that is connected to the gate contacts, and a drain bus 722 that is connected to the drain contacts 725. A source bus (not shown) is connected to the source contacts 705. One individual unit cell transistor 740 is illustrated by the dashed box in FIG. 12A, and includes a gate contact 715 that extends between adjacent source and drain contacts 705, 725.

An anneal may be performed on the structure of FIGS. 12A-12B in an environment that includes oxygen and/or nitrogen in order to convert the exposed outer surfaces of the gate, source and drain contacts 715, 705, 725 into dielectric material, as is shown in FIG. 12C. As shown in FIG. 12C, the interfaces between the top surface and sidewalls of each gate, source and drain contact 715, 705, 725 may be heavily rounded by this anneal, and the interfaces between the bottom surface and sidewalls of each gate, source and drain contact 715, 705, 725 may also be rounded by the anneal, albeit to a lesser extent. This rounding of the lower corner of, for example, the gate contact may reduce the electric field in the upper surface of the barrier layer 730. Many semiconductor materials such as gallium nitride based materials can experience breakdown just like oxides do. Thus, the techniques of the present invention may benefit a wide range of semiconductor devices.

FIGS. 13A through 13E are schematic cross-sectional views illustrating a method for fabricating a MOSFET 500 according to further embodiments of the present invention.

Figure 13A:
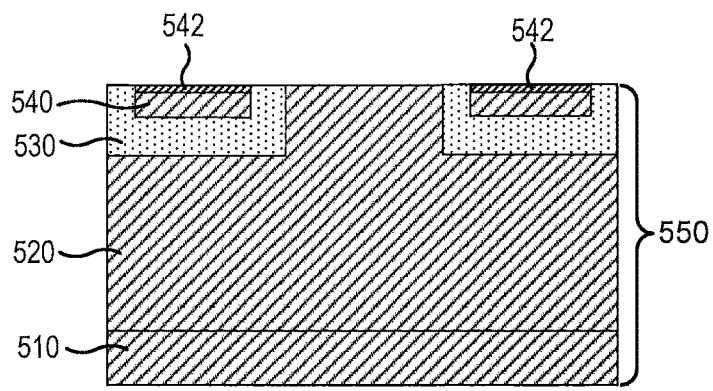
FIGS. 13A through 13E are schematic cross-sectional views illustrating a method for fabricating a MOSFET according to further embodiments of the present invention.

Referring to FIG. 13A, a semiconductor layer structure 550 is formed that includes, for example, a heavily-doped n-type silicon carbide substrate 510, a lightly-doped silicon carbide drift layer 520 that is formed on top of the substrate 510, silicon carbide p-wells 530 that are formed in upper portions of the drift layer 520, and heavily-doped n-type silicon carbide source regions 540 that are formed in central upper portions of the p-wells 530. The upper regions of the source regions 540 are implanted with a high dosage, shallow implant to form a very heavily-doped silicon carbide region 542 in an upper portion of each source region 540. The very heavily-doped silicon carbide regions 542 may be formed, for example, by ion implantation. In example embodiments, the very heavily-doped silicon carbide regions 542 may have peak doping concentrations of at least $1 \times 10^{19}$ atoms/cm$^3$, or at least $1 \times 10^{20}$ atoms/cm$^3$, or at least $5 \times 10^{20}$ atoms/cm$^3$. The depth of the very heavily-doped silicon carbide regions 542, the peak doping concentration thereof and/or the doping profile of these regions 542 (i.e., how the concentration changes with depth from the surface) may be preselected to achieve a desired amount of oxidation in the upper surface of the source regions 540 during a subsequent high temperature processing step (such as formation of the gate dielectric layer) in some embodiments.

Figure 13B:
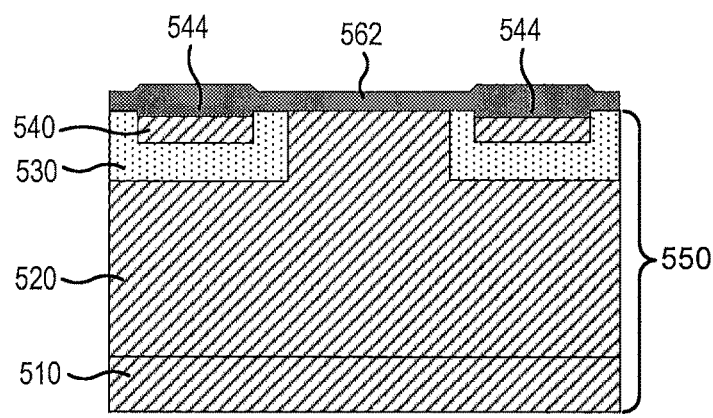

Referring to FIG. 13B, a gate dielectric layer 562 (which in this example is a silicon oxide layer) is then formed on the upper surface of the device. The gate dielectric layer 562 may be formed via, for example, a high temperature deposition process (e.g., it may be formed at processing temperatures in excess of 1000 C). The high dopant concentration in the very heavily-doped silicon carbide regions 542 acts to increase the oxidation rate of these regions as compared to the remainder of the silicon carbide source regions 540 and the silicon carbide p-wells 530. As a result, the very heavily-doped silicon carbide regions 542 may be converted into silicon oxide during the deposition of the gate dielectric layer 562, effectively allowing the silicon oxide gate dielectric layer 562 to "grow" downwardly into the upper surface of each silicon carbide source region 540. The carbon atoms in the very heavily-doped silicon carbide regions 542 evaporate during this high temperature process as the very heavily-doped silicon carbide regions 542 are converted into silicon oxide regions 544. Additionally, since oxygen from the environment is incorporated into silicon oxide regions 544 the portions of silicon oxide layer 562 that are above the source regions 540 also "grow" upwardly, as shown in FIG. 13B, so that the portions of the silicon oxide layer 562 that are above the source regions 540 extend farther in both the downward and upward directions as compared to the remainder of the silicon oxide layer 562. As such, the portions of the silicon oxide layer 562 that are above the source regions 540 are thicker than the remainder of the silicon oxide layer 562.

Figure 13C:
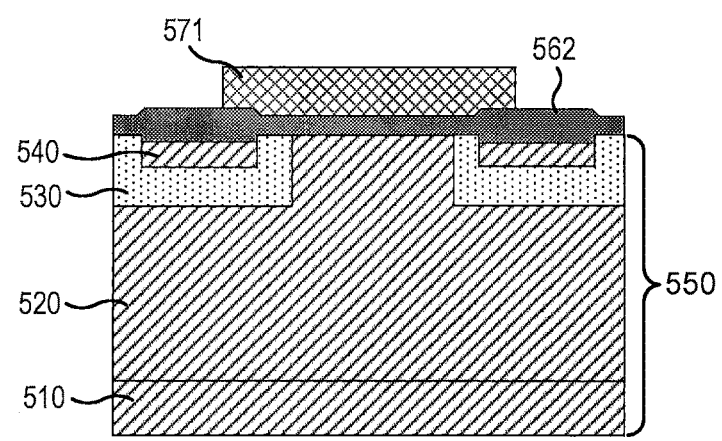

Referring to FIG. 13C, a gate electrode layer (not shown) is then formed on the upper surface of the device and patterned to provide a gate electrode 571. While not shown in FIG. 13C, the outer portions of the upper surface of the gate electrode 571 that are above the thickened regions of the gate dielectric layer 562 may extend higher than the central portion of the upper surface of the gate electrode 571 so that the gate electrode 571 has a relatively constant thickness.

Figure 13D:
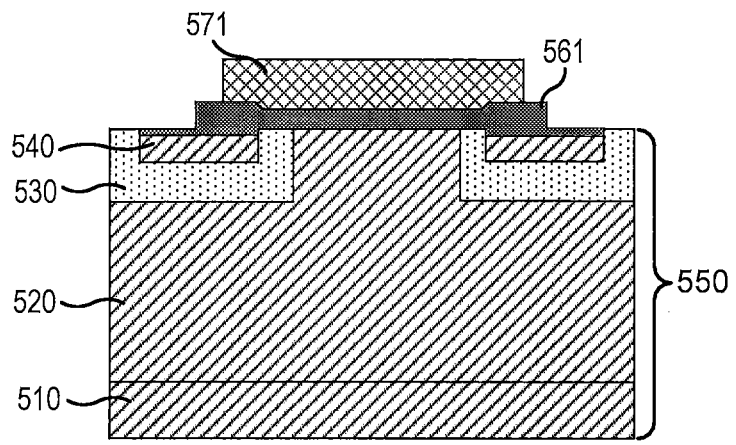

Next, referring to FIG. 13D, the gate dielectric layer 562 may be patterned to form a gate dielectric layer 561. In this embodiment, the gate dielectric layer 562 was patterned separately from the patterning of the gate electrode 571. As shown in FIG. 13D, the gate dielectric layer 561 may be formed to extend laterally beyond the sidewalls of the gate electrode 571. This may be advantageous since the gate dielectric layer 561 may comprise a high quality dielectric material as compared to the dielectric isolation patterns that are used to cover the gate electrodes 571. Having the gate dielectric layer 561 extend laterally beyond the sidewalls of the gate electrode 571 thus may ensure that the portion of the dielectric layer that is above the source regions 540 comprises a high quality silicon oxide (or other dielectric material) that is less susceptible to breakdown. In some embodiments, the gate dielectric layer 561 may extend laterally beyond the sidewalls of the gate electrode 571 the same distance that a subsequently formed dielectric isolation pattern 580 (see FIG. 13E) extends laterally beyond the sidewalls of the gate electrode 570.

Figure 13E:
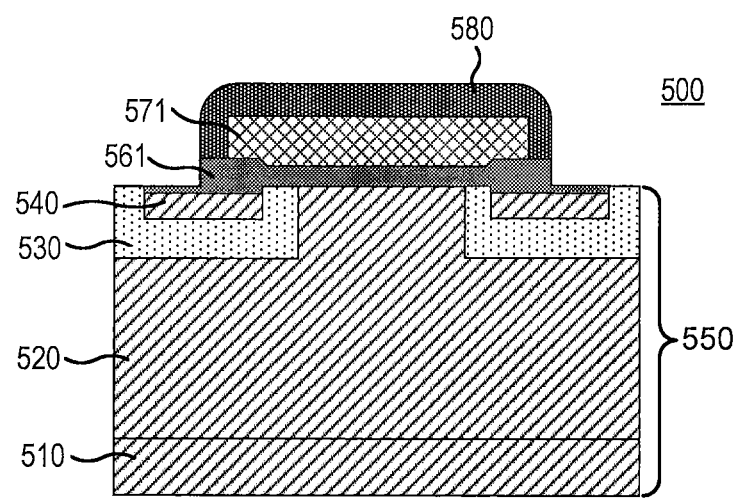

As shown in FIG. 13E, due to the conversion of the upper portion of each source region 540 into dielectric material 544, an upper surface of the portion of the p-well 530 that is on a first side of the source region 540 may extend farther above the drift layer 520 than does an upper surface of the source region 540, and an upper surface of the portion of the p-well 530 that is on a second side of the source region 540 that is opposite the first side may also extend farther above the drift layer 520 than does the upper surface of the source region 540. The gate dielectric layer 561 may have a constant thickness above the channel regions of the device.

While not shown in the figures above, it will be appreciated that the gate dielectric layers in any of the embodiments described herein may be formed to extend laterally beyond the sidewalls of an overlying gate electrode in the same manner discussed above with reference to FIG. 13D.

Finally, referring to FIG. 13E, a dielectric isolation layer (not shown) is formed to cover the upper surface of the semiconductor layer structure 550, the gate dielectric layer 561 and the gate electrode 571. The dielectric isolation layer is then patterned to provide, for example, the dielectric isolation pattern 580 shown in FIG. 13E, to form the semiconductor device 500.

As discussed above, increasing the thickness of the gate dielectric layer above the source regions of a device may advantageously improve the breakdown performance of the device, and the change in the shape of the upper surface of the gate dielectric layer (from a conventional flat shape) to a more nuanced shape adjacent the sidewalls of the gate electrode may lower the peak electric field values. Thus, FIGS. 13A-13E illustrate another technique for improving the breakdown performance of a semiconductor device.

It will also be appreciated that techniques described with reference to FIGS. 13A-13E can be combined with the techniques of any of the previously described embodiments to provide semiconductor devices with even further improved breakdown performance. Two example embodiments of such combined techniques will now be described with reference to FIGS. 14A-14B and 15A-15B.

Figure 14A:
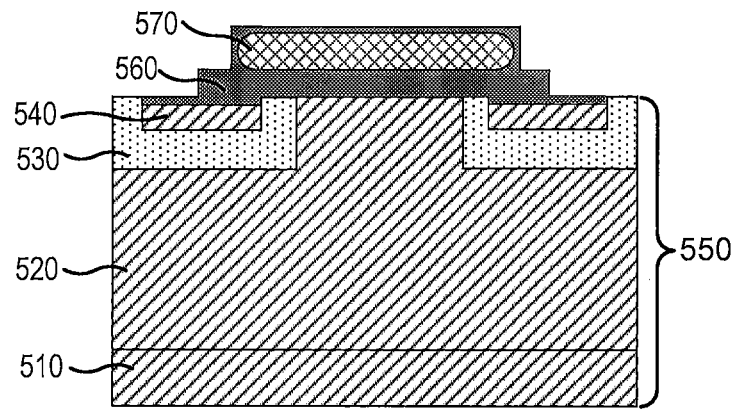
FIGS. 14A and 14B are schematic cross-sectional views illustrating a method for fabricating a MOSFET according to additional embodiments of the present invention.
Figure 14B:
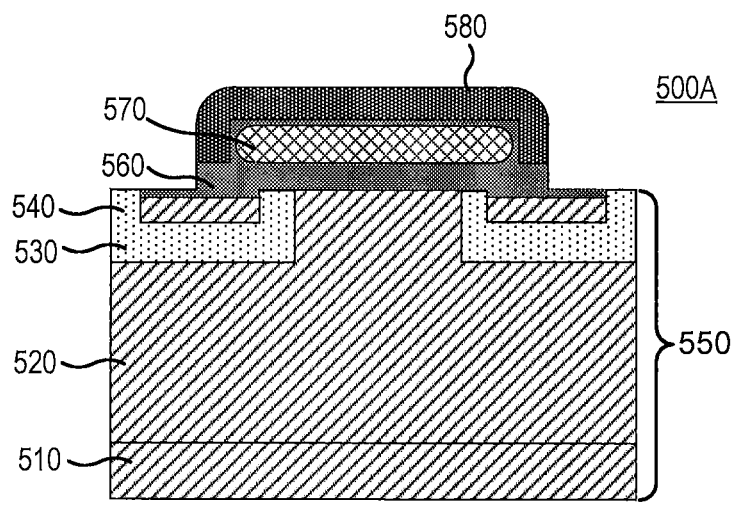

In the first of these embodiments, the semiconductor device shown in FIG. 13D is formed as described above, except that the gate dielectric layer 561 is now considered to be an "initial" gate dielectric layer 561, and the gate electrode 571 is now considered to be an "initial" gate electrode 571. The semiconductor device of FIG. 13D is then annealed in an atmosphere that includes oxygen and/or nitrogen. The anneal may be under, for example, the conditions described above with reference to FIG. 5A. In this embodiment, it is assumed that a less aggressive anneal is used such as the anneal used in the embodiment of FIGS. 5A-5D. The more aggressive anneal discussed above with reference to FIGS. 10A-10C could be used in other embodiments. The anneal converts a portion of the initial gate electrode 571 into dielectric material such as silicon oxide, silicon nitride or silicon oxynitride. For the example of FIGS. 14A-14B, it is assumed that the anneal is performed in an oxygen environment so that the portions of the initial gate electrode 571 that are converted to a dielectric material are converted to silicon oxide, and hence the oxidation of portions of the initial gate electrode 571 cause the initial gate dielectric layer 561 (which here is a silicon oxide layer) to effectively grow or enlarge into gate dielectric layer 560, while the initial gate electrode 571 shrinks in size to become gate electrode 570. As shown in FIG. 14A, the upper surface and sidewalls of the initial gate electrode 571 are oxidized during the anneal, as are the lower corners/sidewalls of the initial gate electrode 571, which results in the gate electrode 570 having sidewalls with rounded profile.

Finally, a dielectric isolation layer (not shown) is formed to cover the upper surface of the semiconductor layer structure 550, the gate dielectric layer 560 and the gate electrode 570. The dielectric isolation layer is then patterned to provide, for example, the dielectric isolation pattern 580 shown in FIG. 14B, thereby providing a semiconductor device 500A. Source metallization may subsequently be deposited in the manner described above with respect to other embodiments.

In the second of these embodiments, the semiconductor device shown in FIG. 13D is again formed as described above, and as in the embodiment of FIGS. 14A-14B, the gate dielectric layer 561 is now considered to be an "initial" gate dielectric layer 561, and the gate electrode 571 is now considered to be an "initial" gate electrode 571. Next, a dielectric isolation layer (not shown) is formed to cover the upper surface of the semiconductor layer structure 550, the initial gate dielectric layer 561 and the initial gate electrode 571. The dielectric isolation layer is then patterned to provide, for example, the dielectric isolation pattern 580 shown in FIG. 15A.

Figure 15A:
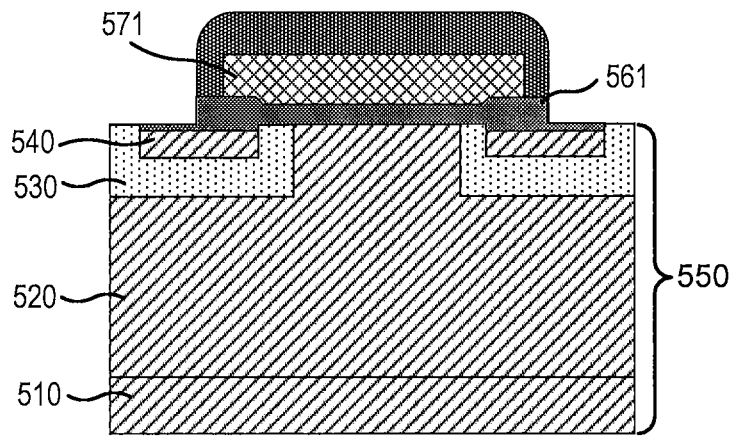
FIGS. 15A and 15B are schematic cross-sectional views illustrating a method for fabricating a MOSFET according to still further embodiments of the present invention.
Figure 15B:
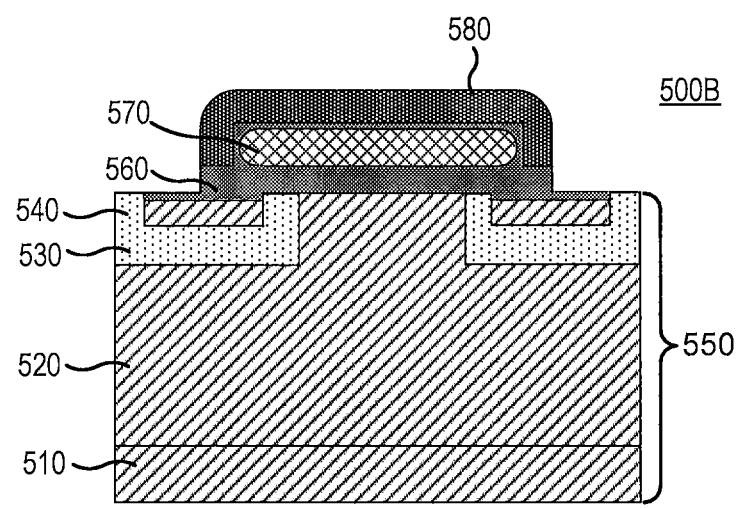

Referring to FIG. 15B, the semiconductor device of FIG. 15A is then annealed in an atmosphere that includes oxygen and/or nitrogen. The anneal may be under, for example, the conditions described above with reference to FIG. 5A. In this embodiment, it is again assumed as an example that a less aggressive anneal is used such as the anneal used in the embodiment of FIGS. 5A-5D. The more aggressive anneal discussed above with reference to FIGS. 10A-10C could be used in other embodiments. The anneal converts a portion of the initial gate electrode 571 into dielectric material such as silicon oxide, silicon nitride or silicon oxynitride. For the example of FIGS. 15A-15B, it is assumed that the anneal is performed in an oxygen environment so that the portions of the initial gate electrode 571 that are converted to a dielectric material are converted to silicon oxide, and hence the oxidation of portions of the initial gate electrode 571 cause the initial gate dielectric layer 561 (which here is a silicon oxide layer) to effectively grow or enlarge into gate dielectric layer 560, while the initial gate electrode 571 shrinks in size to become gate electrode 570. As shown in FIG. 15B, the upper surface and sidewalls of the initial gate electrode 571 are oxidized during the anneal, as are the lower corners/sidewalls of the initial gate electrode 571, which results in the gate electrode 570 having sidewalls with rounded profile. The semiconductor device 500B of FIG. 15B that is formed by this process may be similar to, or even identical to, the semiconductor device 500A of FIG. 14B, but better process control may be obtained with the process used in FIGS. 15A-15B since the oxidation process occur more slowly.

While embodiments of the present invention have been discussed above primarily with respect to semiconductor devices that include silicon gate electrodes, it will be appreciated that embodiments of the present invention are not limited thereto. Thus, in other embodiments, other gate electrode materials may be used, including gate electrodes formed of other semiconductor materials, silicides and/or metals, for example. The oxidation and/or nitridation anneal techniques disclosed herein may be used to convert selected portions of these other gate electrodes into dielectric material.

The present disclosure describes an approach to improve interface protection in metal-oxide (or insulator)-semiconductor (MOS or MIS) devices. This may be particularly useful for improving the gate regions in a power transistor (e.g., a MOSFET, MISFET, or an IGBT). These techniques may also be used in other field effect transistors such as HEMT devices, as discussed above with reference to FIGS. 12A-12C.

While various of the embodiments discussed above illustrate the structure of a unit cell of an n-channel MOSFET, it will be appreciated that pursuant to further embodiments of the present invention, the polarity of each of the semiconductor layers in each device could be reversed so as to provide corresponding p-channel MOSFETs.

The invention has been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on," "connected to," or "coupled to" another element or layer, it can be directly on, connected or coupled to the other element or layer, or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, elements, and/or components, but do not preclude the presence or addition of one or more other features, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the invention.

It will be understood that the embodiments disclosed herein can be combined. Thus, features that are pictured and/or described with respect to a first embodiment may likewise be included in a second embodiment, and vice versa.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A semiconductor device, comprising:
a semiconductor layer structure that comprises silicon carbide;
a gate dielectric layer on the semiconductor layer structure; and
a gate electrode on the gate dielectric layer opposite the semiconductor layer structure,
wherein a periphery of a portion of the gate dielectric layer that underlies the gate electrode is thicker than a central portion of the gate dielectric layer,
wherein a lower surface of the gate electrode has recessed outer edges, and
wherein a periphery of an upper surface of the gate electrode is recessed.

2. The semiconductor device of claim 1, wherein each recessed outer edge of the gate electrode includes multiple beveled or rounded regions.

3. The semiconductor device of claim 1, wherein a lower surface of the gate dielectric layer is substantially flat.

4. The semiconductor device of claim 1, wherein the semiconductor layer structure includes a drift layer having a first conductivity type, a well having a second conductivity type that is opposite the first conductivity type in an upper portion of the drift layer, and a source region having the first conductivity type in the well, wherein the source region is formed via ion implantation, and wherein a concentration of dopants in an upper portion of the source region is selected so that a predetermined portion of the upper portion of the source region will be converted to dielectric material during the formation of the gate dielectric layer.

5. The semiconductor device of claim 3, wherein the semiconductor layer structure includes a drift layer having a first conductivity type, a well having a second conductivity type in an upper portion of the drift layer and a source region having the first conductivity type in an upper portion of the well, and
wherein a channel region is provided in the well between the source region and a portion of the drift layer that contacts the gate dielectric layer.

6. The semiconductor device of claim 3, wherein the recessed outer edges of the lower surface of the gate electrode comprise rounded edges.

7. The semiconductor device of claim 3, wherein a central portion of the gate electrode extends farther above the semiconductor layer structure than does a periphery of the upper surface of the gate electrode.

8. The semiconductor device of claim 5, wherein a portion of the gate dielectric layer beneath the gate electrode that overlies the source region is thicker than a portion of the gate dielectric layer that overlies the channel region.

9. The semiconductor device of claim 5, wherein the semiconductor device is configured so that during on-state operation a peak electric field value in the gate dielectric layer will be located substantially above a sidewall of the channel region that contacts the source region.

10. The semiconductor device of claim 5, wherein the source region is in a central portion of the well, and wherein an upper surface of a portion of the well on a first side of the source region extends farther above the drift layer than does an upper surface of the source region, and an upper surface of a portion of the well on a second side of the source region that is opposite the first side also extends farther above the drift layer than does the upper surface of the source region.

11. The semiconductor device of claim 5, wherein an upper surface of the well extends farther above the drift layer than does an upper surface of the source region.

12. A semiconductor device, comprising:
a semiconductor layer structure that includes silicon carbide, the semiconductor layer structure including a drift layer having a first conductivity type, a well having a second conductivity type that is opposite the first conductivity type in an upper portion of the drift layer, and a source region having the first conductivity type in the well;
a trench in the semiconductor layer structure;
a gate dielectric layer in the trench; and
a gate electrode in the trench on the gate dielectric layer, wherein an upper surface of the gate electrode has recessed outer edges.

13. The semiconductor device of claim 12, wherein a location in the gate dielectric layer where a peak electric field value occurs is spaced inwardly from a sidewall of the gate electrode.

14. The semiconductor device of claim 12, wherein the recessed outer edges of the upper surface of the gate electrode are rounded edges.

15. The semiconductor device of claim 12, wherein a central portion of the gate electrode extends farther above the semiconductor layer structure than does a periphery of the upper surface of the gate electrode.

16. A semiconductor device, comprising:
a semiconductor layer structure that comprises silicon carbide;
a gate dielectric layer on an upper surface of the semiconductor layer structure; and
a gate electrode on the gate dielectric layer opposite the semiconductor layer structure,
wherein a periphery of a portion of the gate dielectric layer that underlies the gate electrode is thicker than a central portion of the gate dielectric layer, wherein a lower surface of the gate electrode has recessed outer edges, wherein the semiconductor layer structure includes a drift layer having a first conductivity type, a well having a second conductivity type in an upper portion of the drift layer and a source region having the first conductivity type in an upper portion of the well, wherein a channel region is provided in the well between the source region and a portion of the drift layer that contacts the gate dielectric layer, and wherein an upper surface of the well extends farther above a bottom surface of the semiconductor device than does an upper surface of the source region.

17. The semiconductor device of claim 16, wherein the gate electrode is at least partially within a trench in the semiconductor layer structure.

18. The semiconductor device of claim 17, wherein an upper surface of the gate electrode has recessed outer edges.

19. The semiconductor device of claim 16, wherein the recessed outer edges of the lower surface of the gate electrode are rounded outer edges.

20. The semiconductor device of claim 16, wherein the gate dielectric layer extends laterally on the semiconductor layer structure beyond a first sidewall of the gate electrode and beyond a second sidewall of the gate electrode.

* * * * *